(12) United States Patent  (10) Patent No.: US 8,004,161 B2
Nagaya et al.  (45) Date of Patent: Aug. 23, 2011

(54) MULTILAYERED PIEZOELECTRIC ELEMENT AND METHOD OF PRODUCING THE SAME

(75) Inventors: Toshiatsu Nagaya, Kuwana (JP); Kouji Noda, Aichi-ken (JP); Masatoshi Ikeda, Aichi-ken (JP); Masaya Nakamura, Nagoya (JP); Daisuke Shibata, Tokai (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 209 days.

(21) Appl. No.: 12/474,499

(22) Filed: May 29, 2009

(65) Prior Publication Data

US 2009/0295255 A1 Dec. 3, 2009

(30) Foreign Application Priority Data

May 30, 2008 (JP) .................................. 2008-141979

(51) Int. Cl.
*H01L 41/08* (2006.01)
(52) U.S. Cl. .......................................... 310/358; 310/364
(58) Field of Classification Search .................. 310/358, 310/364, 365, 311; 252/62.9 PZ, 62.9 R; H01L 41/08, 41/09
See application file for complete search history.

(56) References Cited

U.S. PATENT DOCUMENTS

| | | | |
|---|---|---|---|
| 2,976,246 | A | 3/1961 | Egerton et al. |
| 7,598,659 | B2 * | 10/2009 | Yura et al. ...................... 310/358 |
| 7,618,551 | B2 * | 11/2009 | Yuuya ..................... 252/62.9 PZ |
| 2004/0029711 | A1 | 2/2004 | Suvorov et al. |
| 2004/0058797 | A1 | 3/2004 | Nonoyama et al. |
| 2004/0214723 | A1 | 10/2004 | Nonoyama et al. |
| 2005/0006618 | A1 | 1/2005 | Nanao et al. |
| 2006/0006360 | A1 | 1/2006 | Takao et al. |
| 2007/0216264 | A1 | 9/2007 | Furukawa et al. |

FOREIGN PATENT DOCUMENTS

| | | |
|---|---|---|
| CN | 1514811 | 7/2004 |
| CN | 1609047 | 4/2005 |
| JP | 55-018058 | 2/1980 |
| JP | 2002-068835 | 3/2002 |
| JP | 2002-068836 | 3/2002 |
| JP | 2004-508672 | 3/2004 |
| JP | 2004-244299 | 9/2004 |

(Continued)

OTHER PUBLICATIONS

Chinese Office Action dated Mar. 30, 2010, issued in corresponding Chinese Application No. 200910142023.5, with English translation.
Japanese Office Action dated May 11, 2010, issued in corresponding Japanese Application No. 2008-141979, with English translation.

(Continued)

*Primary Examiner* — Walter Benson
*Assistant Examiner* — Karen Addison
(74) *Attorney, Agent, or Firm* — Nixon & Vanderhye PC

(57) ABSTRACT

A multilayered piezoelectric element and a method of producing the multilayered piezoelectric element are disclosed. The multilayered piezoelectric element is made of piezoelectric ceramic layers and electrode formation layers which are alternately laminated. The piezoelectric ceramic layers are made of crystal oriented ceramic as polycrystalline material. The crystal oriented ceramic is made mainly of an isotropic perovskite type compound in which the specific {100} crystal plane of each of crystal grains that form the polycrystalline material is oriented. The electrode formation layers have electrode parts forming inner electrodes containing a conductive metal. The isotropic perovskite type compound is expressed by a general formula (1):

$$[Ag_h\{Li_x(K_{1-y}Na_y)_{1-x}\}_{1-h}]_j(Nb_{1-z-w}Ta_zSb_w)O_{3-k} \quad (1),$$

where $0 \leq x \leq 0.2$, $0 \leq y \leq 1$, $0 \leq z \leq 0.4$, $0 \leq w \leq 0.2$, $x+z+w>0$, $0<h\leq 0.05$, $0.94\leq j \leq 1$, and $0 \leq k \leq 0.5$).

4 Claims, 4 Drawing Sheets

FOREIGN PATENT DOCUMENTS

| | | |
|---|---|---|
| JP | 2004-323325 | 11/2004 |
| JP | 2006-028001 | 2/2006 |
| JP | 2006-056778 | 3/2006 |
| JP | 2006-248860 | 9/2006 |
| JP | 2007-258280 | 10/2007 |

OTHER PUBLICATIONS

Egerton et al., "Piezoelectric and Dielectric Properties of Ceramics in the System Potassium-Sodium Niobate" Journal of the American Ceramic Society, vol. 42, No. 9, 1959, pp. 436-442.

* cited by examiner

- 1 MULTILAYERED PIEZOELECTRIC ELEMENT
- 3(31) ELECTRODE FORMATION LAYER
- 2 PIEZOELECTRIC CERAMIC LAYER
- 30

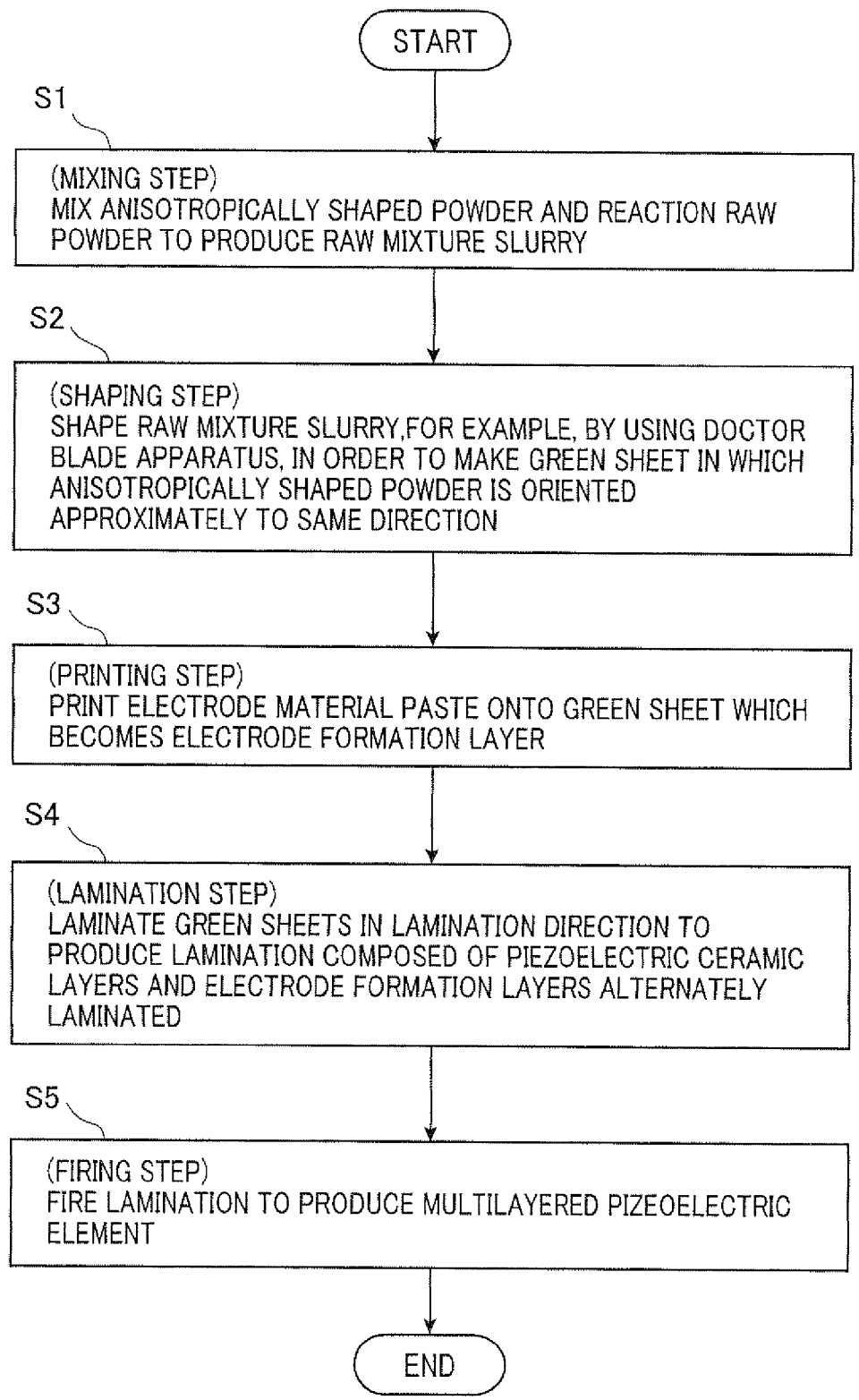

MULTILAYERED PIEZOELECTRIC ELEMENT AND METHOD OF PRODUCING THE SAME

CROSS-REFERENCE TO RELATED APPLICATION

This application, is related to and claims priority from Japanese Patent Application No. 2008-141979 filed on May 30, 2008, the contents of which are hereby incorporated by reference.

BACKGROUND OF THE INVENTION

1. Field of the Invention

The present invention relates to a multilayered piezoelectric element in which a plurality of piezoelectric ceramic layers and a plurality of electrode formation layers are alternately laminated. The present invention also relates to a method of producing the multilayered piezoelectric element.

2. Description of the Related Art

A multilayered piezoelectric element is comprised of piezoelectric ceramic layers and electrode formation layers that are alternately laminated. The piezoelectric ceramic layer is deformable, expanded and/or contracted when a voltage is applied. The electric forming layer forms an internal electrode. For example, Japanese patent laid open publication No. JP 2007-258280 has disclosed a conventional multilayered piezoelectric element. In the production of such a multilayered piezoelectric element, a electrode material containing AgPd alloy is printed on a green sheet made of multilayered piezoelectric ceramic, and a plurality of those printed green sheets is laminated in a lamination direction, and the green sheets forming a lamination are integrally fired.

A recent demand in this technical field is to improve or increase the deformation dimension of such a multilayered piezoelectric element when a voltage is applied. In order to solve such a recent demand, various types of piezoelectric materials have been developed. In particular, according to environmental conservation and for reducing influence to the environment, it is strongly demanded to develop a piezoelectric material of lead free material which does not contain any lead. For example, Japanese patent laid open publications No. JP 2002-68835, JP 2002-68836, JP2004-244299, JP2004-323325, and JP2006-56778 have disclosed such lead free piezoelectric materials containing no lead.

However, because such conventional lead free piezoelectric materials have low piezoelectric characteristics, a multilayered piezoelectric element made of those lead free piezoelectric materials cannot provide a necessary deformation dimension.

In order to solve such a conventional problem in the piezoelectric material filed, for example, Japanese patent laid open publication No. JP 2006-28001 has disclosed a crystal-oriented ceramics made of polycrystalline material that is made mainly of isotropic perovskite type compound. In the crystal-oriented ceramics, crystals are oriented in a specific direction (or a specific crystal plane). Because this crystal-oriented ceramics has a high density and a highly crystal orientation, it is expected to improve or increase the deformation properties of the multilayered piezoelectric element comprised of the crystal-oriented ceramics as piezoelectric ceramic layers.

However, when the multilayered piezoelectric element comprised of piezoelectric ceramic layers and electrode formation layers that are alternately and integrally laminated is produced using such crystal-oriented ceramics made of polycrystalline material that is made mainly of isotropic perovskite type compound, a component element such as Ag forming the inner electrode is easily evaporated, or diffused into the ceramics. As a result, this decreases the electrode formation ratio of an electrode part to the total surface of the electrode formation layer.

SUMMARY OF THE INVENTION

It is an object of the present invention to provide a multilayered piezoelectric element with high deformation properties. The multilayered piezoelectric element is made of piezoelectric ceramic layers and electrode formation layers that are alternately laminated. The piezoelectric ceramic layers are made of crystal oriented ceramics with a high crystal orientation ratio. The electrode formation layers have inner electrodes capable of suppressing decrease of electrode formation ratio. It is another object of the present invention to provide a method of producing the multilayered piezoelectric element.

To achieve the above purposes, a first aspect of the present invention provides a multilayered piezoelectric element made of piezoelectric ceramic layers and electrode formation layers which are alternately laminated. The piezoelectric ceramic layers are made of crystal oriented ceramics as polycrystalline material made mainly of an isotropic perovskite type compound. In the crystal oriented ceramics, the specific {100} crystal plane of each of crystal grains forming the polycrystalline material is oriented. The electrode formation layers have electrode parts that form inner electrodes containing a conductive metal. In particular, the piezoelectric ceramic layers is made of crystal oriented ceramics made mainly of an isotropic perovskite type compound expressed by a general formula (1),

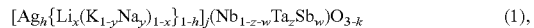

where $0 \leq x \leq 0.2$, $0 \leq y \leq 1$, $0 \leq z \leq 0.4$, $0 \leq w \leq 0.2$, $x+z+w>0$, $0<h \leq 0.05$, $0.94 \leq j \leq 1$, and $0 \leq k \leq 0.5$).

In the first aspect of the present invention, the piezoelectric ceramic layers are made of crystal oriented ceramics. The crystal oriented ceramics is made mainly of an isotropic perovskite type compound expressed by a general formula (1),

where $0 \leq x \leq 0.2$, $0 \leq y \leq 1$, $0 \leq z \leq 0.4$, $0 \leq w \leq 0.2$, $x+z+w>0$, $0<h \leq 0.05$, $0.94 \leq j \leq 1$, $0 \leq k \leq 0.05$). Accordingly, it is possible to suppress the conductive metal such as Ag that forms the inner electrodes being diffused in the piezoelectric ceramic layers even if the piezoelectric ceramic layers and the inner electrodes are integrally fired to produce the multilayered piezoelectric element. That is, as expressed in the general formula (1), Ag is added in advance to the A site element of the isotropic perovskite type compound expressed by $ABO_3$ as a component of the crystal oriented ceramics forming the piezoelectric ceramic layers. This can suppress the diffusion of the conductive metal and also suppress the decrease of the electrode formation ratio.

In general, the conductive metal such as Ag is easily substituted with A site metal such as K (potassium) of the isotropic perovskite type compound expressed by $ABO_3$. However, according to the present invention the substitution of the conductive metal such as Ag with A site element can be suppressed. Therefore the substituted A site element such as K (potassium) can increase the concentration of the A site element such as K near the crystal grain boundary in the piezoelectric ceramic layers made of the crystal oriented ceramics. This structure can suppress the decrease of the insulation resistance of the piezoelectric ceramic layers.

Further, in the general formula (1), a predetermined amount of Ag is substituted with the above A-site element.

Still further, the ratio of A site element and B site element is adjusted to be within a predetermined range ($0.94 \leq j \leq 1$). Therefore this can suppress the decrease of the orientation degree and the decrease of the density. As a result, the multilayered piezoelectric element has the superior deformation properties.

As described above, the first aspect of the present invention provides the multilayered piezoelectric element having a high orientation ratio of the crystal oriented ceramics in the piezoelectric ceramic layers, and superior deformation properties. Thus, the present invention can suppress any decrease of the inner electrode formation ratio.

A second aspect of the present invention provides a method of producing a multilayered piezoelectric element. The multilayered piezoelectric element comprises piezoelectric ceramic layers and electrode formation layers which are alternately laminated. The piezoelectric ceramic layers are made of crystal oriented ceramics as polycrystalline material made mainly of an isotropic perovskite type compound. In the polycrystalline material, the specific {100} crystal plane of each of crystal grains is oriented. The electrode formation, layers has electrode parts that form inner electrodes containing a conductive metal, and the isotropic perovskite type compound is expressed by the general formula (1):

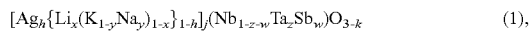

$$[Ag_h\{Li_x(K_{1-y}Na_y)_{1-x}\}_{1-h}]_j(Nb_{1-z-w}Ta_zSb_w)O_{3-k} \qquad (1),$$

where $0 \leq x \leq 0.2$, $0 \leq y \leq 1$, $0 \leq z \leq 0.4$, $0 \leq w \leq 0.2$, $x+z+w>0$, $0<h \leq 0.05$, $0.94 \leq j \leq 0$, $0 \leq k \leq 0.5$). In particular, the method comprises a mixing step, a shaping step, a printing step, a laminating step, and a firing step.

The mixing step mixes an anisotropically shaped powder and a reaction raw powder. The anisotropically shaped powder is made of anisotropically shaped oriented grains, in which the specific {100} crystal plane of each of the anisotropically shaped oriented grains is oriented. The reaction raw powder, generating the isotropic perovskite type compound expressed by the general formula (1) when reacted with the anisotropically shaped powder in order to produce a raw mixture. The shaping step shapes the raw mixture so that the specific {100} crystal plane of each of the anisotropically shaped oriented grains is oriented approximately into the same direction in order to produce a green sheet having a sheet shape. The printing step prints onto the green sheet an electrode material which becomes the electrode parts after completion of the firing step. The laminating step laminates the green sheets after completion of the printing in a lamination direction of the multilayer piezoelectric element to produce a laminate. Finally, the firing step fires the lamination to react and integrally sinter the anisotropically shaped powder and the reaction raw powder on the green sheets in order to produce the multilayered piezoelectric element in which the piezoelectric ceramic layers and the electrode formation layers are alternately laminated.

As described above, according to the second aspect of the present invention, the series of the mixing step, the shaping step, the printing step, the lamination step, and the firing step can produce the multilayered piezoelectric element. The mixing step produces the raw mixture by mixing the anisotropically shaped powder and the reaction raw powder.

The shaping step shapes the raw mixture so that the specific {100} crystal plane of the anisotropically shaped powder is oriented approximately to the same direction. It is thereby possible to produce the green sheets in which the {100} crystal plane of the anisotropically shaped powder is oriented approximately to the same direction.

Next, the printing step prints the electrode material on the green sheets. Then, the lamination step laminates a plurality of the green sheets including the green sheets with the printed electrode materials. It is thereby possible to produce the lamination in which a plurality of the green sheets is laminated.

Finally, the firing step fires the lamination. During the firing step, the anisotropically shaped powder and the reaction raw powder in the lamination are reacted and sintered to produce the piezoelectric ceramic layers made of the polycrystalline material made mainly of the isotropic perovskite type compound expressed by the general formula (1). Further, the electrode parts are formed at the area on which the electrode material is printed. In the firing step, because the anisotropically shaped powder, which is oriented approximately in the same direction, is reacted with the reaction raw powder, it is possible to produce the piezoelectric ceramic layers made of the crystalline oriented ceramics.

In the firing step, the piezoelectric ceramic layers are produced, which are made of the polycrystalline material made mainly of the isotropic perovskite type compound expressed by the general formula (1). It is therefore possible to suppress the diffusion of the conductive metal such as Ag contained in the electrode material into the piezoelectric ceramic layers. That is, as expressed by the general formula (1), it is possible to suppress the diffusion of the conductive metal by adding Ag in advance into A site elements of the isotropic perovskite type compound expressed by the general formula of $ABO_3$ as a component element of the crystal oriented ceramics forming the piezoelectric ceramic layers. It is thereby possible to suppress the decrease of the electrode formation ratio.

Still further, the conductive metal such as Ag is easily substituted in general with A site element such as K of the isotropic perovskite type compound. However, the present invention can suppress such a substitution. Accordingly, it is possible to increase the concentration of A site element such as K near to the crystal grains of the piezoelectric ceramic layers, and thereby to suppress the decrease of the insulation resistance properties of the piezoelectric ceramic layers.

Still further, a predetermined amount of Ag is substituted with the A site element described above, and the ratio of A site element and B site element is adjusted to have a predetermined range ($0.94 \leq j \leq 1$). It is thereby possible to suppress the decrease of the degree of orientation and the decrease of density. It is possible for the multilayered piezoelectric element to have superior deformation properties.

As described above, it is possible for the second aspect of the present invention to provide the method of producing the multilayered piezoelectric element having a high degree of orientation of the crystal oriented ceramics in the piezoelectric ceramic layers, and the superior deformation properties while suppressing the decrease of the inner electrode formation ratio.

BRIEF DESCRIPTION OF THE DRAWINGS

A preferred, non-limiting embodiment of the present invention will be described by way of example with reference to the accompanying drawings, in which:

FIG. 4 is a flow chart briefly showing a method of producing the multilayered piezoelectric element according to the present invention.

DETAILED DESCRIPTION OF THE PREFERRED EMBODIMENTS

Figure 1A:
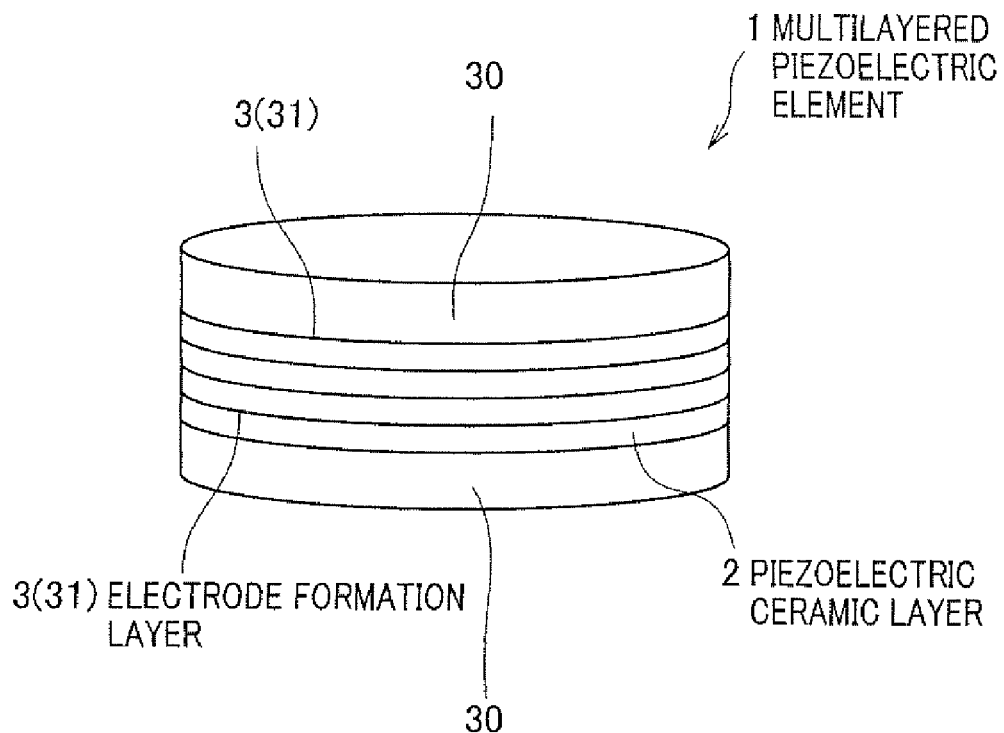
FIG. 1A is a diagram showing an entire structure of a multilayered piezoelectric element according to the first embodiment of the present invention.

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of the multilayered piezoelectric element according to the first embodiment of the present invention with reference to FIG. 1A, FIG. 1B, FIG. 2A, FIG. 2B, and FIG. 4.

Figure 1B:
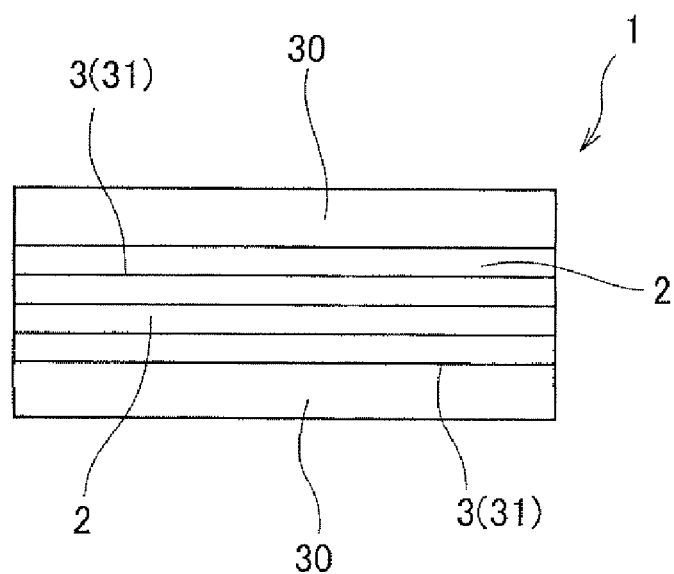
FIG. 1B is a diagram showing a cross section of the multilayered piezoelectric element in its lamination direction shown in FIG. 1A according to the first embodiment of the present invention.

The multilayered piezoelectric element 1 according to the first embodiment shown in FIG. 1A and FIG. 1B is composed of piezoelectric ceramic layers 2 and electrode formation layers 3 which are alternately laminated. Each of the piezoelectric ceramic layers 2 is made of polycrystalline material composed mainly of isotropic perovskite type compound in which the specific {100} crystal plane of each of crystal grains that form the polycrystalline material is oriented. Each of the electrode formation layers 3 forms an inner electrode.

As shown in FIG. 1A and FIG. 1B, dummy layers 30 are formed on both the ends of the lamination of the multilayered piezoelectric element 1, respectively.

The piezoelectric ceramic layers 2 and the electrode formation layers 3 are made of crystal-oriented ceramics made mainly of isotropic perovskite type compound expressed by a general formula (1):

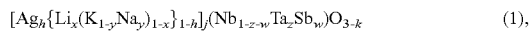

$$[Ag_h\{Li_x(K_{1-y}Na_y)_{1-x}\}_{1-h}]_j(Nb_{1-z-w}Ta_zSb_w)O_{3-k} \qquad (1),$$

where $0 \leq x \leq 0.2$, $0 \leq y \leq 1$, $0 \leq z \leq 0.4$, $0 \leq w \leq 0.2$, $x+z+w>0$, $0<h\leq 0.05$, $0.94\leq j\leq 1$, and $0\leq k\leq 0.5$.

The electrode part 31 is made of AgPd alloy.

The multilayered piezoelectric element 1 according to the first embodiment is produced by performing a mixing step (S1), a shaping step (S2), a printing step (S3), a lamination step (S4), and a firing step (S5). FIG. 4 shows the flow chart to produce the multilayered piezoelectric element according to the present invention which briefly shows the mixing step (S1), the shaping step (S2), the printing step (S3), the lamination step (S4), and the firing step (S5).

The mixing step mixes an anisotropically shaped powder and a reaction power to produce a raw material mixture or raw mixture in short. The anisotropically shaped powder is made of anisotropically shaped crystal oriented grains in which the specific {100} crystal plane of each of the grains is oriented. The isotropic perovskite type compound is generated by the reaction of the raw material mixture composed of the anisotropically shaped powder and the reaction raw powder.

The first embodiment uses, as reaction raw powder, a first reaction raw powder made of isotropic perovskite type compound expressed by the general formula (4) $\{Li_p(K_{1-q}Na_q)_{1-p}\}_c(Nb_{1-r-s}Ta_rSb_s)O_3$, where $0\leq p\leq 1$, $0\leq q\leq 1$, $0\leq r\leq 1$, $0\leq s\leq 1$, and $0.95\leq c\leq 1.05$, a second reaction raw powder made of $AgNbO_3$ powder, and/or a third reaction raw powder made of $Nb_2O_5$ powder.

The shaping step produces a green sheet by shaping the raw material mixture so that the specific {100} crystal plane of each of the anisotropically shaped oriented grains of the anisotropically shaped powder are oriented approximately to the same direction.

The printing step prints an electrode material onto the parts. The electrode materials become the electrode parts on the electrode formation layer 3 by performing the following firing step.

In the lamination step, a plurality of green sheets is laminated to produce the lamination body by performing the printing step.

In the firing step, the lamination body is fired to produce the multilayered piezoelectric element as the lamination body A description will now be given of the method of producing the multilayered piezoelectric element according to the first embodiment of the present invention in detail.

<Mixing Step>

At first, anisotropically shaped powder was made, which is composed mainly of $Na(Nb_{0.93}Ta_{0.07})O_3$.

Specifically, $Bi_2O_3$ powder, $NaHCO_3$ powder, $Nb_2O_5$ powder, and $Ta_2O_5$ were weighted and wet mixed in order to obtain a $Bi_{2.5}Na_{3.5}(Nb_{0.93}Ta_{0.07})_5O_{18}$ chemical stoichiometry ratio.

Next, 100 wt. % of the obtained mixture and 80 wt. % of NaCl as flux were dry mixed for one hour.

Next, obtained mixture was placed in Pt crucible or melting pot made of Pt and fired at 1100° C. for two hours in order to synthesize $Bi_{2.5}Na_{3.5}(Nb_{0.93}Ta_{0.07})_5O_{18}$. The obtained mixture was heated at the heating rate of 150° C./h from room temperature until 850° C., and performed at the heating rate of 100° C./h from 850° C. until 1100° C., and then cooled at a cooling rate of 150° C./h. After this cooling, the mixture was washed by hot water in order to eliminate the flux component from the mixture. This produced $Bi_{2.5}Na_{3.5}(Nb_{0.93}Ta_{0.07})_5O_{18}$ powder of a plate-shape having an oriented crystal plane {001} (maximum plane).

Next, the obtained $Bi_{2.5}Na_{3.5}(Nb_{0.93}Ta_{0.07})_5O_{18}$ powder was grounded into powder by a jet mill. The $Bi_{2.5}Na_{3.5}(Nb_{0.93}Ta_{0.07})_5O_{18}$ is powder after grinding has an average grain size of 12 μm, and an aspect ratio within approximate range from 10 to 20.

Next, 1 mole of $Bi_{2.5}Na_{3.5}(Nb_{0.93}Ta_{0.07})_5O_{18}$ powder and 2 mol of $NaHCO_3$ powder were mixed and dry mixed in order to obtain the mixture. 100 wt. % of this mixture and 80 wt. % of NaCl as flux were mixed and dry mixed together for one hour.

Next, the obtained mixture was heated at 950° C. for eight hours in a Pt crucible in order to synthesize $Na(Nb_{0.93}Ta_{0.07})O_3$. This heating was performed at a heating rate of 200° C./h from room temperature until 700° C., and at a heating rate of 50° C./h from 700° C. until 950° C. Then, this mixture was cooled at a cooling rate of 150° C./h in order to obtain a reactant.

Because this reactant contains $Bi_2O_3$ in addition to $Na(Nb_{0.93}Ta_{0.07})O_3$, the reactant was washed by hot water to eliminate the flux component from the reactant. After this, $Bi_2O_3$ was eliminated from the reactant. That is, at first, reactant after eliminating the flux component was mixed in 2.5 N $HNO_3$ for four hours in order to dissolve $Bi_2O_3$ which was produced as surplus component into $HNO_3$ solution. The solution was filtered to separate $Na(Nb_{0.93}Ta_{0.07})O_3$ powder. This $Na(Nb_{0.93}Ta_{0.07})O_3$ powder was washed by ion exchanged water. The anisotropically shaped powder made of $Na(Nb_{0.93}Ta_{0.07})O_3$ powder was thereby obtained.

This anisotropically shaped powder is a plate-shaped powder having a pseudo cubic oriented {100} crystal plane as a maximum plane (oriented plane), an average grain size of 12 µm, and an aspect ratio within approximate range from 10 to 20.

Next, a description will now be given of the production of reaction raw material powder.

At first, $NaHCO_3$ powder, $KHCO_3$ powder, $Li_2CO_3$ powder, $Nb_2O_5$ powder, $Ta_2O_5$ powder, and $NaSbO_3$ powder which are commercially available were weighted in order to obtain a $\{Li_{0.05}(K_{0.5}Na_{0.55})_{0.95}\}(Nb_{0.835}Ta_{0.1}Sb_{0.065})O_3$ chemical stoichiometry ratio. Then, those were wet mixed in organic solvent using $ZrO_2$ balls in order to obtain a mixture.

The obtained mixture was calcined at 750° C. for five hours, and then wet grounded up in organic solvent using $ZrO_2$ balls for twenty hours in order to obtain calcined powder having an average grain size of approximately 0.5 µm (first reaction raw powder).

Next, $Ag_2O$ powder and $Nb_2O_5$ powder commercially available were weighted in order to obtain an $AgNbO_3$ chemical stoichiometry ratio.

Then, those powders were wet mixed in organic solution using $ZrO_2$ balls for twenty hours. The mixture was calcined at 850° C. for five hours. The mixture was then grounded up in organic solution using $ZrO_2$ balls for twenty hours in order to obtain $AgNbO_3$ powder having an average grain size of approximately 0.5 µm (second reaction raw powder).

In the first embodiment, $Nb_2O_5$ powder having an average grain size of approximately 0.5 µm was prepared as third reaction raw powder.

Next, anisotropically shaped powder and the first reaction raw powder were weighted in a molar ratio of 0.05:0.95 (anisotropically shaped powder:first reaction raw powder). The second reaction raw powder and the third reaction raw powder were added into the mixture so that the second reaction raw powder and the third reaction raw powder had the molar ratio (will be explained later in Table 1) per 1 mole of the mixture (composed of the anisotropically shaped powder and the first reaction raw powder).

After this, the mixture was wet mixed in organic solution using $ZrO_2$ balls for twenty hours in order to obtain slurry of raw material mixture. A binder (polyvinyl butyral) and plasticizer (dibutyl phthalate) were added into the slurry and then mixed. 8.0 g of the binder and 4.0 g of plasticizer were added per 100 g of raw mixture (powdered component). This made the raw mixture slurry.

<Shaping Step>

Next, the raw mixture slurry produced above was shaped by a doctor blade apparatus in order to obtain a green sheet (in a tape shaped sheet) of a thickness of 100 µm. At this time, the anisotropically shaped powder can be oriented in approximately the same direction in the green sheet by a shearing force acting on the anisotropically shaped powder.

<Printing Step>

Next, AgPd alloy powder containing 30 mol % of Pd was prepared. The AgPd alloy powder and the first reaction raw powder were mixed in volume ratio of 9:1. Ethyl cellulose and terpineol were added into the mixture to make electrode material paste. The obtained electrode material paste was printed on the electrode area to be formed on the green sheet. In the multilayered piezoelectric element according to the first embodiment, the electrode material paste was printed on the electrode formation layer 3 in order to form the electrode part 31 on the entire surface of the electrode formation layer 3 between the piezoelectric ceramic layers 2. (see FIG. 1A and FIG. 1B)

<Lamination Step>

Next, the green sheets on which the electrode material paste was printed were laminated and pressed in order to a lamination after the printing step (which became the electrode formation layers after firing). This lamination has a thickness of 1.2 mm. In the lamination step, the green sheets without printing of the electrode material paste were placed at both the end surfaces of the lamination. Those green sheets without printing formed dummy layers 30 (see FIG. 1A and FIG. 1B).

Next, the lamination was fired at a temperature of 400° C. to remove grease component from the lamination.

<Firing Step>

Next, the lamination after the removal of grease was placed on Pt plate in a magnesia bowl, then heated under atmosphere at an inert temperature of 1120° C. for two hours, and finally cooled until a room temperature to produce the multilayered piezoelectric element. The heating was performed at a heating rate of 200° C./h and the cooling was performed at a cooling rate of 10° C./h between 1120° C. to 1000° C. and at a cooling rate of 200° C./h from 1000° C. until room temperature.

Next, the obtained multilayered piezoelectric element was machined in order to produce a circular shaped disk having a diameter of 7.5 mm and a thickness (or height) of 0.7 mm.

The multilayered piezoelectric elements 1 (samples E1 to E4, sample C1, and sample C2) were produced by the above steps, in each of which the piezoelectric ceramic layers 2 made of crystal oriented ceramics and the electrode parts 31 made of Ag/Pd alloy (electrode formation layers 3) were alternately laminated.

Table 1 shows the chemical composition of the anisotropically shaped powder and first to third reaction raw powders used in the production of each of the samples E1 to E4, C1, and C2, and further shows the amount of the second reaction raw powder ($AgNbO_3$ powder) and the third reaction raw powder ($Nb_2O_5$ powder).

Table 2 shows a target composition of the crystal oriented ceramics in the piezoelectric ceramic layers in each of the samples. Because the oxygen ratio (designated by "k" in Table 2) was changed by the firing, the value of quantitative analysis for the crystal ceramics in the cross section of the lamination was detected by X-ray micro-analyzer (EPMA: Electron probe Micro-Analysis). Specifically, an amount of oxygen element was obtained when a sum amount of B site elements (a sum amount of Nb, Ta, and Sb) was 1, and the oxygen ratio "k" was obtained by subtracting the amount of oxygen element from 3. For example, when B site element is 1 and Oxygen element is 2.5, the oxygen ratio "k" takes 0.5.

Next, the bulk density of each of the multilayered piezoelectric element (samples E1 to E4, C1, and C2) was measured.

Specifically, the dry weight of the multilayered piezoelectric element when it was dried was measured.

Next, the multilayered piezoelectric element was immersed into water in order to enter water into the inside of the multilayered piezoelectric element through the open pores thereof, and a wet weight of the multilayered piezoelectric element containing water was detected.

Next, the volume of open pores in the multilayered piezoelectric element was calculated based on the difference between the dry weight and the wet weight of the multilayered piezoelectric element.

The volume of the multilayered piezoelectric element excepting the open pores was measured based on Archimedes method.

Next, the bulk density of the multilayered piezoelectric element was measured by dividing the dry weight of the multilayered piezoelectric element by the total volume of the multilayered piezoelectric element, where the total volume is a sum of the volume of the open pores and the volume of the part excepting the open pores. Table 2 shows the calculation results.

In the first embodiment, the oriented direction of the piezoelectric ceramic layer in each of the samples was detected.

Specifically, the surface perpendicular to the lamination direction of the multilayered piezoelectric element (the surface parallel to the green sheet surface) was grinded or polished. An average orientation degree of the {100} crystal plane in the polished surface was calculated based on Lotgering method by the following Mathematical equation (1) using an average orientation degree F. (HKL):

$$F(HKL) = [\{\Sigma'I(HKL)/\Sigma I(hkl)\} - \{\Sigma'Io(HKL)/\Sigma Io(hkl)\}] / [1 - \{\Sigma'Io(HKL)/\Sigma Io(hkl)\}] \times 100(\%)$$ (Mathematical equation 1), where $\Sigma I(hkl)$ is a total sum of detected X-ray diffraction strengths of all of crystal planes (hkl) of crystal oriented ceramics, $\Sigma Io(hkl)$ is a total sum of detected X-ray diffraction strengths of all of crystal planes (hkl) of crystal non-oriented ceramics having the same composition of the crystal oriented ceramics, $\Sigma'I(HKL)$ is a total sum of detected X-ray diffraction strengths of a specific crystal plane (HKL) which is equivalent in crystallographic analysis to the crystal oriented ceramics, and $\Sigma'Io(HKL)$ is a total sum of detected X-ray diffraction strengths of the specific crystal plane (HKL) which is equivalent in crystallographic analysis to the crystal non-oriented ceramics having the same composition of the crystal oriented ceramics.

The polished surface has the surface of the depth of 100 to 200 μm measured from the fired surface and separated by 100 to 200 μm from the inner electrode. Table 2 shows the detection results.

Further, electrode formation ratio of the inner electrode was detected in each of the samples.

Specifically, the multilayered piezoelectric element as sample was grinded or polished in the lamination direction to make a mirror surface on which the inner electrode was exposed in parallel.

Next, the sum of length L1 and the sum of length L2 were detected in the longitudinal direction of the exposed inner electrode by a laser microscope, where the length L1 was a total length of the formation part of the inner electrode (made of AgPd alloy), and the length L2 was a total length of the formation part (ceramics part and pores) without any electrode (without AgPd alloy part).

That is, the electrode formation ratio is expressed as follows:

Electrode formation ratio (%) = $L1/(L1+L2) \times 100$.

Next, the deformation characteristics of each of the samples were analyzed.

Figure 2A:
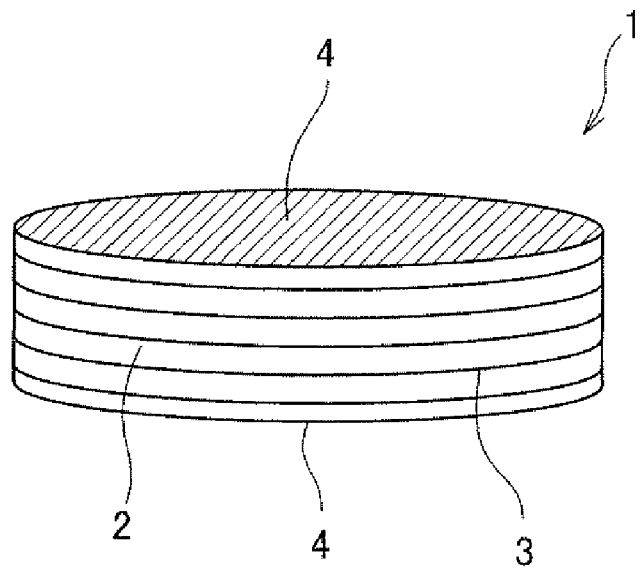
FIG. 2A is a diagram showing the entire structure of the multilayered piezoelectric element in which opposition electrodes are formed in the lamination direction on both end surfaces according to the first embodiment of the present invention.
Figure 2B:
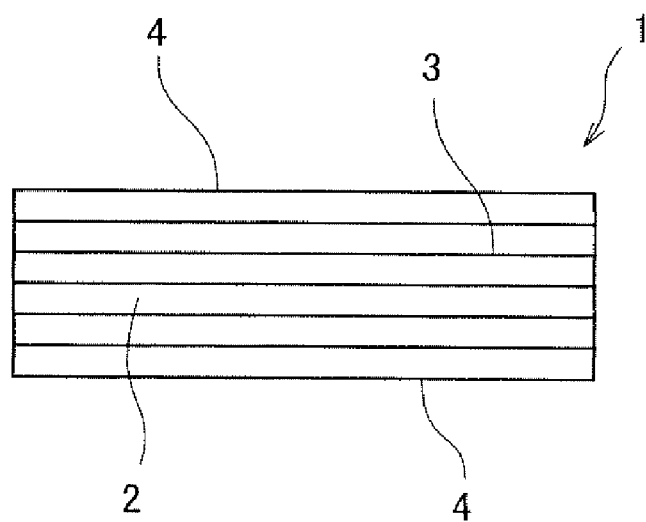
FIG. 2B is a diagram showing a cross section of the multilayered piezoelectric element in which the opposition electrodes are formed in the lamination direction on both the end surfaces shown in FIG. 2A.

Specifically, opposition electrodes 4 were formed on both the end surfaces of the multilayered piezoelectric element of each of the samples in the lamination direction by Au thin film deposition, as shown in FIG. 2A and FIG. 2B.

The multilayered piezoelectric element after forming the opposition electrodes 4 was immersed into silicon oil at a temperature of 100° C., and an electric field of 2 kV/mm was applied to the opposition electrodes 4 for twenty minutes in order to produce polarization.

Next, an electric field of 2 kV/mm was applied under room temperature to the opposition electrodes 4 of the multilayered piezoelectric element after polarization. At this time, the deformed amount $\Delta L(m)$ of the multilayered piezoelectric element was detected.

A dynamic strain amount D33 (mV) was calculated by the following equation (A):

$$D33 = \Delta L/L/EF$$ (A), where D33 designates dynamic strain amount (m/V), EF denotes maximum electric field (V/m), and L indicates Length (m) of the multilayered piezoelectric element in the lamination direction sandwiched between the opposite electrodes 4 before a voltage was applied.

TABLE 1

| Sample No. | Composition of First reaction raw powder | Composition of anisotropically shaped powder | $Nb_2O_5$ (mol) | $AgNbO_3$ (mol) |
|---|---|---|---|---|
| C1 | $\{Li_{0.05}(K_{0.45}Na_{0.55})_{0.95}\}(Nb_{0.835}Ta_{0.1}Sb_{0.065})O_3$ | $Na(Nb_{0.93}Ta_{0.07})O_3$ | 0.01 | 0 |
| E1 | $\{Li_{0.05}(K_{0.45}Na_{0.55})_{0.95}\}(Nb_{0.835}Ta_{0.1}Sb_{0.065})O_3$ | $Na(Nb_{0.93}Ta_{0.07})O_3$ | 0.01 | 0.005 |
| E2 | $\{Li_{0.05}(K_{0.45}Na_{0.55})_{0.95}\}(Nb_{0.835}Ta_{0.1}Sb_{0.065})O_3$ | $Na(Nb_{0.93}Ta_{0.07})O_3$ | 0.01 | 0.01 |
| E3 | $\{Li_{0.05}(K_{0.45}Na_{0.55})_{0.95}\}(Nb_{0.835}Ta_{0.1}Sb_{0.065})O_3$ | $Na(Nb_{0.93}Ta_{0.07})O_3$ | 0.01 | 0.02 |
| E4 | $\{Li_{0.05}(K_{0.45}Na_{0.55})_{0.95}\}(Nb_{0.835}Ta_{0.1}Sb_{0.065})O_3$ | $Na(Nb_{0.93}Ta_{0.07})O_3$ | 0.01 | 0.05 |
| C2 | $\{Li_{0.05}(K_{0.45}Na_{0.55})_{0.95}\}(Nb_{0.835}Ta_{0.1}Sb_{0.065})O_3$ | $Na(Nb_{0.93}Ta_{0.07})O_3$ | 0.01 | 0.08 |

TABLE 2

| Sample No. | Piezoelectric ceramic layer | | | | | | | Bulk density (g/cm³) | Oriented ratio (%) | Inner electrode Electrode formation ratio (%) | D33 (pm/V) |
|---|---|---|---|---|---|---|---|---|---|---|---|
| | Composition of crystal oriented ceramics $[Ag_h\{Li_j(K_{1-y}Na_y)_{1-j}\}_{1-h}]_x(Nb_{1-z-w}Ta_zSb_w)O_{3-k}$ | | | | | | | | | | |
| | h | j | x | y | z | w | k | | | | |
| C1 | 0 | 0.980 | 0.048 | 0.574 | 0.098 | 0.061 | 0.350 | 4.75 | 91 | 27 | 480 |
| E1 | 0.005 | 0.980 | 0.048 | 0.574 | 0.096 | 0.060 | 0.320 | 4.74 | 91 | 40 | 482 |
| E2 | 0.010 | 0.981 | 0.048 | 0.574 | 0.096 | 0.060 | 0.290 | 4.76 | 92 | 48 | 474 |
| E3 | 0.020 | 0.981 | 0.048 | 0.574 | 0.095 | 0.059 | 0.250 | 4.78 | 91 | 58 | 466 |

TABLE 2-continued

| | Piezoelectric ceramic layer | | | | | | | | Inner electrode | |
|---|---|---|---|---|---|---|---|---|---|---|
| Sample | Composition of crystal oriented ceramics $[Ag_h\{Li_x(K_{1-y}Na_y)_{1-x}\}_{1-h}]_j(Nb_{1-z-w}Ta_zSb_w)O_{3-k}$ | | | | | | Bulk density | Oriented ratio | Electrode formation | D33 |
| No. | h | j | x | y | z | w | k (g/cm³) | (%) | ratio (%) | (pm/V) |
| E4 | 0.048 | 0.981 | 0.048 | 0.574 | 0.092 | 0.058 | 0.280 | 4.82 | 89 | 67 | 443 |
| C2 | 0.074 | 0.982 | 0.048 | 0.574 | 0.090 | 0.056 | 0.300 | 4.86 | 76 | 70 | 360 |

As clearly understood from the experimental results shown in Table 1 and Table 2, sample C1 made without using Ag source as reaction raw powder has superior characteristics D33 such as a high density of crystal oriented ceramics of the piezoelectric ceramic layer and a high crystal orientation ratio. However, sample C1 has a very low electrode formation ratio of 27(%).

On the other hand, samples E1 to E4 in which Ag additive of not more than 0.05 mole (h≦0.05) have an adequately high bulk density and crystal orientation ratio when compared with those of sample C1. Therefore, samples E1 to E4 have superior deformation properties that are good enough for practical use. Still further, samples E1 to E4 can suppress the electrode formation ratio from being decreased when compared with that of sample C1. In other words, samples E1 to E4 have superior electrode formation ratio.

On the other hand, although sample C2 with Ag additive of more than 0.05 mole (h>0.05) has a high electrode formation ratio, it has a drastically low orientation ratio of crystal oriented ceramics in the piezoelectric ceramic layer. Therefore sample C2 has low deformation properties which are insufficient for practical use.

As described above, according to the first embodiment of the present invention, the multilayered piezoelectric element (samples E1 to E4) has superior high orientation ratio of the crystal oriented ceramics in the piezoelectric ceramic layer and superior deformation properties and can suppress the decrease of the inner electrode formation ratio, where the multilayered piezoelectric element (samples E1 to E4) has the piezoelectric ceramic layers made of crystal oriented ceramics described above that is made mainly of isotropic perovskite type compound expressed by a general formula $[Ag_h\{Li_x(K_{1-y}Na_y)_{1-x}\}_{1-h}]_j(Nb_{1-z-w}Ta_zSb_w)O_{3-k}$ (where $0 \leq x \leq 0.2$, $0 \leq y \leq 1$, $0 \leq z \leq 0.4$, $0 \leq w \leq 0.2$, $x+z+w>0$, $0<h \leq 0.05$, $0.94 \leq j \leq 1 \leq k \leq 0.5$).

Second Embodiment

A description will be given of the multilayered piezoelectric element according to the second embodiment of the present invention.

The second embodiment produces the multilayered piezoelectric element using, as anisotropically shaped powder, an acid-treated anisotropically shaped raw material made of bismuth layered perovskite type compound.

In the second embodiment, deformation properties and electrode formation ratio of the multilayered piezoelectric element are detected when a ratio of A site and B site (value j=A site/B site) of isotropic perovskite type compound that is expressed by the general formula (1):

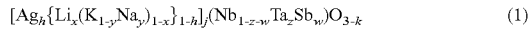
$[Ag_h\{Li_x(K_{1-y}Na_y)_{1-x}\}_{1-h}]_j(Nb_{1-z-w}Ta_zSb_w)O_{3-k}$ (1)

is decreased.

The second embodiment produces a multilayered piezoelectric element having piezoelectric layers made of crystal oriented ceramics in which the {100} crystal plane of crystal grains forming polycrystalline material is oriented. The polycrystalline material is made of isotropic perovskite type compound expressed by the general formula (1), where h=0 to 0.01, j=0.938 to 0.975, x=0.058, y=0.562, z=0.094 to 0.098, and w=0.059 to 0.062.

A description will now be given of the method of producing the isotropically shaped powder.

Specifically, at first, like the method of the first embodiment, $Bi_{2.5}Na_{3.5}(Nb_{0.93}Ta_{0.07})_5O_{18}$ powder was produced.

Next, 6N of HCL was added into $Bi_{2.5}Na_{3.5}(Nb_{0.93}Ta_{0.07})_5O_{18}$ powder so as to produce the relationship of 30 ml of 6N HCL per 1 g of $Bi_{2.5}Na_{3.5}(Nb_{0.93}Ta_{0.07})_5O_{18}$ powder. Those were mixed at a temperature of 60° C. for twenty four hours in order to make a mixture.

The mixture was processed by suction filtration. This suction filtration as acid washing treatment was performed several times (two times in the second embodiment) to obtain $Bi_{2.5}Na_{3.5}(Nb_{0.93}Ta_{0.07})_5O_{18}$ is powder after acid treatment. The $Bi_{2.5}Na_{3.5}(Nb_{0.93}Ta_{0.07})_5O_{18}$ powder is called to as the "anisotropically shaped powder".

A component analysis for the anisotropically shaped powder (after acid treatment) was performed by using an energy dispersive X-ray apparatus (EDX). An identification for the crystal phase of the anisotropically shaped powder was also performed by using a X-ray diffraction apparatus (XRD). The results of the analysis show that the anisotropically shaped powder has a complicated structure including the structure of perovskite based compound, and the anisotropically shaped powder is made mainly of a powder expressed by $Na_{0.50}(Nb_{0.93}Ta_{0.07})O_3$.

This anisotropically shaped powder was a smoothed plate-shaped surface having an average grain size of approximately 12 μm, an aspect ratio of approximately 10 to 20.

Next, the first reaction raw powder was produced. In the second embodiment, like the method of the first embodiment, the first reaction raw powder was produced by using $NaHCO_3$ powder, $KHCO_3$ powder, $Li_2CO_3$ powder, $Nb_2O_5$ powder, $Ta_2O_5$ powder, and $NaSbO_3$ powder, which are commercially available, were weighted to produce the chemical stoichiometry ratio of $\{Li_{0.06}(K_{0.45}Na_{0.55})_{0.94}\}(Nb_{0.835}Ta_{0.1}Sb_{0.065})O_3$.

Next, an anisotropically shaped powder and the first reaction raw powder were weighted to make a mole ratio of 0.05:0.95 (anisotropically shaped powder:first reaction raw powder). Further, a mole, shown in following Table 3, of the sum of the second reaction raw powder and/or the third reaction raw powder was added per 1 mol. of the above mixture of the anisotropically shaped powder and the first reaction raw powder.

Next, like the method of the first embodiment, those were wet mixed in organic solvent using $ZrO_2$ balls in order to make a slurry.

A binder (polyvinyl butyral) and plasticizer (dibutyl phthalate) were added into the above slurry, and then mixed to produce the raw mixture slurry.

Like the first embodiment, the shaping step, the printing step, the lamination step, and the firing step were performed for the raw mixture slurry.

The multilayered piezoelectric elements (samples E5, E6, C3, and C4) were produced by the above steps, in each of which the piezoelectric ceramic layers made of crystal oriented ceramics and the electrode parts made of Ag/Pd alloy (electrode formation layers) were alternately laminated.

Table 3 shows the chemical composition of the anisotropically shaped powder and the reaction raw powders used in the production of each of the samples E5, E6, C3, and C4, and further shows the added amount of the second reaction raw powder ($AgNbO_3$ powder) and the third reaction raw powder ($Nb_2O_5$ powder). In addition, Table 4 shows a target composition of the crystal oriented ceramics in the piezoelectric ceramic layers in each of the samples E5, E6, C3, and C4. The bulk density, the orientation ratio, the electrode formation ratio, and the deformation ratio (D33) of each of the samples E5, E6, C3, and C4 were also measured. Table 4 shows those measurement results.

a high bulk density and a high orientation degree, and has therefore superior deformation ratio, but has a decreased electrode formation ratio.

Accordingly, it is preferable to provide a predetermined amount ($0 < h \leq 0.05$) of Ag in the general formula (1), and to have not less than 0.94 ($j \geq 0.94$) of the ratio (j) between A site element and B site element when the multilayered piezoelectric element is produced.

Third Embodiment

A description will be given of the multilayered piezoelectric element and the method of producing it according to the third embodiment of the present invention. In particular, the third embodiment produces the multilayered piezoelectric element using $Ag_2O$ powder.

Further, in the third embodiment, the deformation properties and electrode formation ratio were investigated in both cases when the ratio between A site element and B site element is 1, and when exceeds 1 in the general formula (1):

$$[Ag_h\{Li_x(K_{1-y}Na_y)_{1-x}\}_{1-h}]_j(Nb_{1-z-w}Ta_zSb_w)O_{3-k} \quad (1).$$

TABLE 3

| Sample No. | Composition of First reaction raw powder | Composition of anisotropically shaped powder | $Nb_2O_5$ (mol.) | $AgNbO_3$ (mol.) |
|---|---|---|---|---|
| C3 | $\{Li_{0.06}(K_{0.45}Na_{0.55})_{0.94}\}(Nb_{0.835}Ta_{0.1}Sb_{0.065})O_3$ | $Na_{0.5}(Nb_{0.93}Ta_{0.07})O_3$ | 0 | 0 |
| E5 | $\{Li_{0.06}(K_{0.45}Na_{0.55})_{0.94}\}(Nb_{0.835}Ta_{0.1}Sb_{0.065})O_3$ | $Na_{0.5}(Nb_{0.93}Ta_{0.07})O_3$ | 0 | 0.01 |
| E6 | $\{Li_{0.06}(K_{0.45}Na_{0.55})_{0.94}\}(Nb_{0.835}Ta_{0.1}Sb_{0.065})O_3$ | $Na_{0.5}(Nb_{0.93}Ta_{0.07})O_3$ | 0.01 | 0.01 |
| C4 | $\{Li_{0.06}(K_{0.45}Na_{0.55})_{0.94}\}(Nb_{0.835}Ta_{0.1}Sb_{0.065})O_3$ | $Na_{0.5}(Nb_{0.93}Ta_{0.07})O_3$ | 0.02 | 0.01 |

TABLE 4

| | Piezoelectric ceramic layer | | | | | | | | | Inner electrode Electrode formation ratio (%) | D33 (pm/V) |
|---|---|---|---|---|---|---|---|---|---|---|---|
| Sample No. | Composition of crystal oriented ceramics $[Ag_h\{Li_x(K_{1-y}Na_y)_{1-x}\}_{1-h}]_j(Nb_{1-z-w}Ta_zSb_w)O_{3-k}$ | | | | | | | Bulk density (g/cm³) | Oriented ratio (%) | | |
| | h | j | x | y | z | w | k | | | | |
| C3 | 0 | 0.975 | 0.058 | 0.562 | 0.098 | 0.062 | 0.340 | 4.77 | 88 | 32 | 467 |
| E5 | 0.010 | 0.975 | 0.058 | 0.562 | 0.098 | 0.061 | 0.390 | 4.79 | 90 | 54 | 479 |
| E6 | 0.010 | 0.956 | 0.058 | 0.562 | 0.096 | 0.060 | 0.450 | 4.77 | 97 | 48 | 506 |
| C4 | 0.010 | 0.938 | 0.058 | 0.562 | 0.094 | 0.059 | 0.430 | 4.78 | 96 | 35 | 500 |

As clearly understood from the experimental results shown in Table 3 and Table 4, like the first embodiment, sample C3 made without using Ag source as reaction raw powder has superior characteristics D33 such as a high density of crystal oriented ceramics of the piezoelectric ceramic layer and a high crystal orientation ratio. However, sample C3 has a very low electrode formation ratio 32(%).

On the other hand, the multilayered piezoelectric elements (samples E5 and E6) having not less than 0.94 of the ratio between A site and B site in the crystal oriented ceramics (A site/B site, namely, value j in the general formula (1)) have an adequately high bulk density and crystal orientation ratio when compared with those of sample C3. Therefore, samples E5 and E6 have superior deformation properties that are good enough for practical use. Still further, samples E5 and E6 can suppress the electrode formation ratio to be decreased when compared with that of sample C3. In other words, samples E5 and E6 have superior electrode formation ratio.

On the other hand, sample C4 with Ag additive having less than 0.94 of the ratio of A site element and B site element has Specifically, at first, like the method of the first embodiment, the anisotropically shaped powder Na $(Nb_{0.93}Ta_{0.07})O_3$ powder was produced.

Next, the first reaction raw powder was produced.

In the third embodiment, the first reaction raw powder was used, in which K was only decreased in amount from formula $\{Li_{0.055}(K_{0.45}Na_{0.55})_{0.95}\}(Nb_{0.835}Ta_{0.1}Sb_{0.065})O_3$ of the chemical stoichiometry ratio.

Specifically, $NaHCO_3$ powder, $KHCO_3$ powder, $Li_2CO_3$ powder, $Nb_2O_5$ powder, $Ta_2O_5$ powder, and $NaSbO_3$ powder, which are commercially available, were weighted in order to produce the first reaction raw powder having 0.99 as the ratio of A site/B site (A site/B site=0.99) in $\{Li_{0.055}(K_{0.439}Na_{0.55})_{0.945}\}(Nb_{0.835}Ta_{0.1}Sb_{0.065})O_3$ of chemical stoichiometry ratio.

Next, $Ag_2O$ powder having an average grain size of approximately 0.5 μm was prepared as the second reaction raw powder.

Next, an anisotropically shaped powder and the first reaction raw powder were weighted to make a mole ratio of 0.05:0.95 (anisotropically shaped powder:first reaction raw powder). Further, the second reaction raw powder was added to the mixture of the anisotropically shaped powder and the first reaction raw powder under the condition of 0.005 mol. of the second reaction raw powder per 1 mol. of the sum of the anisotropically shaped powder and the first reaction raw powder.

Next, like the method of the first embodiment, those powders were wet mixed in organic solvent using $ZrO_2$ balls in order to make a slurry.

A binder (polyvinyl butyral) and plasticizer (dibutyl phthalate) were added into the obtained slurry, and then mixed to produce the raw mixture slurry.

After this, like the first embodiment, the shaping step, the printing step, the lamination step, and the firing step were performed for the raw mixture slurry.

The multilayered piezoelectric element (sample E7) was produced by the above steps, in which the piezoelectric ceramic layers made of crystal oriented ceramics and the electrode parts made of Ag/Pd alloy (electrode formation layers) were alternately laminated.

In the third embodiment, two types of multilayered piezoelectric elements (samples C5 and C6) were produced as compared with the sample E7. Specifically, like the method of the first embodiment, the anisotropically shaped powder Na$(Nb_{0.93}Ta_{0.07})O_3$ powder was produced Next, $NaHCO_3$ powder, $KHCO_3$ powder, $Li_2CO_3$ powder, $Nb_2O_5$ powder, $Ta_2O_5$ powder, and $NaSbO_3$ powder, which are commercially available, were weighted, and the first reaction raw powder was then produced by using the method of the first embodiment.

Next, $Ag_2O$ powder having an average grain size of approximately 0.5 μm was prepared as the second reaction raw powder.

Next, a raw mixture was produced using the anisotropically shaped powder and the first reaction raw powder by the following method.

In preparation of the sample C5, the anisotropically shaped powder and the first reaction raw powder were weighted to make a mole ratio of 0.05:0.95 (anisotropically shaped powder:first reaction raw powder). Then, like the method of the first embodiment, those powders were wet mixed in organic solvent using $ZrO_2$ balls in order to make a slurry. A binder (polyvinyl butyral) and plasticizer (dibutyl phthalate) were added into the obtained slurry, and then mixed to produce the raw mixture slurry.

On the other hand, in preparation of the sample C6, the anisotropically shaped powder and the first reaction raw powder were weighted to make a mole ratio of 0.05:0.95 (anisotropically shaped powder:first reaction raw powder). Then, the second reaction raw powder was added to the anisotropically shaped powder and the first reaction raw powder under the condition of 0.005 mol. of the second reaction raw powder per 1 mol. of the sum of the anisotropically shaped powder and the first reaction raw powder.

Next, those powders were wet mixed in organic solvent using $ZrO_2$ balls in order to make a slurry. A binder (polyvinyl butyral) and plasticizer (dibutyl phthalate) were added into the obtained slurry, and then mixed to produce the raw mixture slurry.

After this, like the first embodiment, the shaping step, the printing step, the lamination step, and the firing step were performed for the obtained raw mixture slurry. The multilayered piezoelectric elements (sample C5 and C6) were thereby produced by the above steps, in which the piezoelectric ceramic layers made of crystal oriented ceramics and the electrode parts made of Ag/Pd alloy (electrode formation layers) were alternately laminated.

Table 5 shows the chemical composition of the anisotropically shaped powder and the reaction raw powders used in the production of each of the samples E7, C5, and C6, and further shows the added amount of the second reaction raw powder ($Ag_2O$ powder). In addition, Table 6 shows a target composition of the crystal oriented ceramics in the piezoelectric ceramic layers in each of the samples E7, C5, and C6. Further, like the first embodiment, the bulk density, the orientation ratio, the electrode formation ratio, and the deformation ratio (D33) of each of the samples E7, C5, and C6 were also detected. Table 6 shows those detection results.

TABLE 5

| Sample No. | Composition of First reaction raw powder | Composition of anisotropically shaped powder | $Ag_2O$ (mol.) |
|---|---|---|---|
| C5 | $\{Li_{0.055}(K_{0.45}Na_{0.55})_{0.945}\}(Nb_{0.835}Ta_{0.1}Sb_{0.065})O_3$ | $Na(Nb_{0.93}Ta_{0.07})O_3$ | 0 |
| C6 | $\{Li_{0.055}(K_{0.45}Na_{0.55})_{0.945}\}(Nb_{0.835}Ta_{0.1}Sb_{0.065})O_3$ | $Na(Nb_{0.93}Ta_{0.07})O_3$ | 0.005 |
| E7 | $\{Li_{0.055}(K_{0.439}Na_{0.55})_{0.945}\}(Nb_{0.835}Ta_{0.1}Sb_{0.065})O_3$ | $Na(Nb_{0.93}Ta_{0.07})O_3$ | 0.005 |

TABLE 6

| Sample No. | Piezoelectric ceramic layer | | | | | | | | | Inner electrode Electrode formation ratio (%) | D33 (pm/V) |
|---|---|---|---|---|---|---|---|---|---|---|---|
| | Composition of crystal oriented ceramics $[Ag_h\{Li_j(K_{1-y}Na_y)_{1-x}\}_{1-h}]_x(Nb_{1-z-w}Ta_zSb_w)O_{3-k}$ | | | | | | | Bulk density (g/cm³) | Oriented ratio (%) | | |
| | h | j | x | y | z | w | k | | | | |
| C5 | 0 | 1.000 | 0.052 | 0.574 | 0.098 | 0.062 | 0.230 | 4.74 | 88 | 25 | 457 |
| C6 | 0.010 | 1.010 | 0.052 | 0.574 | 0.098 | 0.062 | 0.240 | 4.77 | 89 | 48 | Short circuit by Polarization |
| E7 | 0.010 | 1.000 | 0.053 | 0.580 | 0.098 | 0.062 | 0.260 | 4.76 | 88 | 47 | 456 |

As clearly understood from the results shown in Table 5 and Table 6, like the first embodiment, sample C5 made without using Ag source as reaction raw powder has superior characteristics D33 such as a high density of crystal oriented ceramics of the piezoelectric ceramic layer and a high crystal orientation ratio. However, sample C5 has a very low electrode formation ratio 25(%).

On the other hand, the multilayered piezoelectric element (sample E7) having not less than 1.00 of the ratio between A site element and B site element in the crystal oriented ceramics (A site/B site, namely, the "j" value in the general formula (1)) have an adequately high bulk density and crystal orientation ratio which are equal to or greater than that of sample C5. Therefore, sample E7 has superior deformation properties that is well enough for practical use. Still further, sample E7 can suppress the electrode formation ratio to be decreased when compared with that of sample C5. In other words, sample E7 has superior electrode formation ratio.

On the other hand, sample C6 with Ag additive having more than 1.00 of the ratio of A site element and B site element has a high bulk density and a high orientation degree, and has therefore superior deformation ratio, but has a decreased electrical resistance and made a short circuit (s/c) during polarization.

Accordingly, it is preferable to add a predetermined amount ($0 < h \leqq 0.05$) of Ag in the general formula (1), and to have the ratio (j) between the A site element and the B site element not less than 1.00 ($j \geqq 1.00$) when the multilayered piezoelectric element is produced.

Fourth Embodiment

A description will be given of the multilayered piezoelectric element and the method of producing it according to the fourth embodiment of the present invention with reference to FIG. 3. In particular, the fourth embodiment produces the multilayered piezoelectric element having a partial electrode part as the electrode part and external electrodes are formed at both the sides of the multilayered piezoelectric element.

Figure 3:
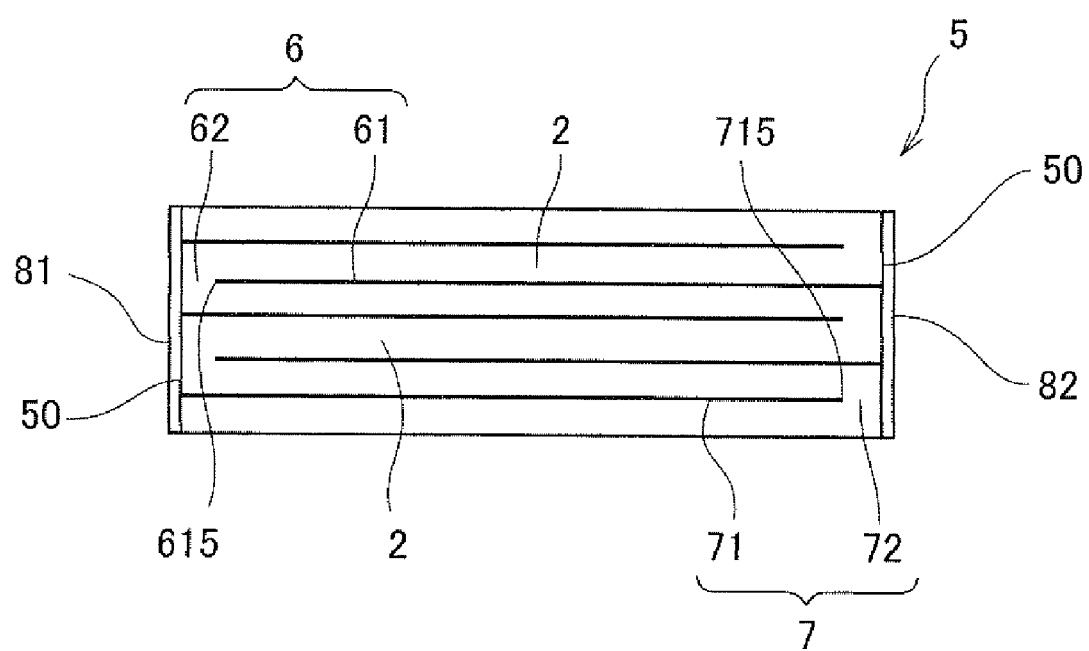
FIG. 3 is an explanatory diagram showing a cross section of the multilayered piezoelectric element in its lamination direction according to the fourth embodiment of the present invention.

As shown in FIG. 3, the multilayered piezoelectric element 5 according to the fourth embodiment is composed of a plurality of piezoelectric ceramic layers 2 and a plurality of electrode formation layers 6, 7 having electrode parts 61, 71. The piezoelectric ceramic layers 2 and the electrode formation layers 6, 7 are alternately laminated. The electrode formation layers 6, 7 have the electrode parts 61, 71 and non-electrode formation parts 62, 72.

As shown in FIG. 3, end parts 615, 715 of the electrode parts 61, 71 are formed at a predetermined distance measured from the outer peripheral surface 50 of the multilayered piezoelectric element 5 in the inside direction which is perpendicular to the lamination direction.

Strictly speaking, the non-electrode formation parts 62, 72 are not electrode formation layers. The non-electrode formation parts 62, 72 are parts jointed between the adjacent piezoelectric ceramic layers 2 in the lamination direction by sintering the multilayered piezoelectric element 5. That is, the non-electrode formation parts 62, 72 and the piezoelectric ceramic layers 2 are made of crystal oriented ceramics.

In the structure of the multilayered piezoelectric element 5 according to the fourth embodiment of the present invention, the areas measured from the outer periphery of the end parts 615, 715 of the electrode parts 61, 71 to the end surfaces 50 of the multilayered piezoelectric element 5 are referred to the "non-electrode formation parts 62, 72 shown in FIG. 3.

A pair of outer electrodes 81, 82 is formed at the outer peripheral surfaces 50 of the multilayered piezoelectric element 5.

The electrode parts 61, 71 in the adjacent electrode formation layers 6, 7 are electrically connected to the outer electrodes 81, 82, respectively.

In the fourth embodiment, each of the piezoelectric ceramic layers 2 is made of the crystal oriented ceramics, like the sample E1 according to the first embodiment, A description will now be given of the method of producing the multilayered piezoelectric element 5 according to the fourth embodiment.

At first, like the method of the second embodiment, the isotropically shaped powder $Bi_{2.5}Na_{3.5}(Nb_{0.93}Ta_{0.07})_5O_{18}$ as acid treatment material was produced.

Next, like the method of the first embodiment, the first reaction raw powder was produced by using $NaHCO_3$ powder, $KHCO_3$ powder, $Li_2CO_3$ powder, $Nb_2O_5$ powder, $Ta_2O_5$ powder, and $NaSbO_3$ powder, which are commercially available, were weighted to produce the chemical stoichiometry ratio of $\{Li_{0.055}(K_{0.4}Na_{0.6})_{0.945}\}(Nb_{0.835}Ta_{0.1}Sb_{0.065})O_3$.

Next, like the method of the first embodiment, the second reaction raw powder ($AgNbO_3$ powder) and the third reaction raw powder ($Nb_2O_5$ powder) were prepared.

Next, the anisotropically shaped powder and the first reaction raw powder were weighted to make a mole ratio of 0.05:0.95 (anisotropically shaped powder:first reaction raw powder). Further, 0.26 mol. of the second reaction raw powder and 0.01 mol, of the third reaction raw powder were added per 1 mol. of the above mixture of the anisotropically shaped powder and the first reaction raw powder.

Next, like the method of the first embodiment, those powders were wet mixed in organic solvent using $ZrO_2$ balls in order to make a slurry.

A binder (polyvinyl butyral) and plasticizer (dibutyl phthalate) were added into the obtained slurry, and then mixed to produce the raw mixture slurry.

Next, like the method of the first embodiment, the green sheets were produced in the shaping step, which is a sheet (of a tape shape) of a thickness of 80 μm.

Next, like the first embodiment, AgPd alloy powder containing 30 mol. % of Pd was prepared. The AgPd alloy powder and the first reaction raw powder were mixed in volume ratio of 9:1. Ethyl cellulose and terpineol were added into the mixture to make electrode material paste. The obtained electrode material paste was printed on the electrode formation area to be formed on the green sheet. In the multilayered piezoelectric element according to the fourth embodiment, the electrode material paste were printed so that the electrode parts 61, 71 and the outer periphery end parts 615, 715 were formed at the inside area of the non-electrode formation parts 62, 72 observed from the outer peripheral surfaces 50 (see FIG. 3).

Next, the green sheets were laminated and pressed in the lamination direction so that the non-electrode formation parts 62, 72 were alternately positioned at the different sides of the multilayered piezoelectric element 5. The multilayered piezoelectric element 5 has the lamination composed of fifty electrode material layers (became the electrode formation layers after firing). Next, the lamination was fired at a temperature of 400° C. to eliminate the flux component from the mixture.

Next, like the method of the first embodiment, the firing step was performed for the lamination to produce the multilayered piezoelectric element 5 in which the piezoelectric ceramic layers 2 and the electrode formation layers 6, 7 are alternately laminated.

Next, the pair of the outer electrodes 81, 82 was formed at both the side surfaces 50 of the multilayered piezoelectric element 5. The outer electrodes 81, 82 were formed by baking Ag paste containing glass component on the end surfaces 50. Each of the outer electrodes 81, 82 was electrically connected to the corresponding each of the electrode parts 62, 72 of the adjacent electrode formation layers 6, 7 in the multilayered piezoelectric element 5.

After this baking, the polarization was performed to produce the multilayered piezoelectric element 5 having a body size of 7 mm (Length)×7 mm (Width)×3.7 mm (Height in lamination direction), a layer thickness of 60 μm, and fifty electrode formation layers.

FIG. 3 shows the multilayered piezoelectric element 5. In particular, a plurality of the electrode formation layers is omitted from FIG. 3 for brevity. FIG. 3 shows only the five electrode formation layers.

As shown in FIG. 3, the multilayered piezoelectric element 5 according to the fourth embodiment, the piezoelectric ceramic layers 2 and the electrode formation layers 6, 7 are alternately laminated. In particular, the electrode formation layers 6, 7 have the electrode parts 61, 71 that form the inner electrode parts having conductive properties and the non-electrode formation parts 62, 72. The non-electrode formation parts 62, 72 are formed in the inside area observed from the outer peripheral surfaces 50 by a predetermined length. Accordingly, when observed along the lamination direction, the multilayered piezoelectric element 5 has the two parts, a piezoelectric activation area and a non-piezoelectric activation area. In the piezoelectric activation area, all of the electrode parts 61 and 71 are overlapped when observed along the lamination direction. On the other hand, a part of the electrode parts 61 and 71 is overlapped in the non-piezoelectric activation area when observed along the lamination direction.

The pair of the external electrodes 81, 82 is formed on the side surfaces 50 of the multilayered piezoelectric element 5 so that the side surfaces 50 are sandwiched by the outer electrodes 81, 82. The outer electrodes 81, 82 are alternately and electrically connected to the inner electrodes (electrode parts 61, 71) which are adjacent to each other in the multilayered piezoelectric element 5.

Accordingly, when a voltage is applied to the outer electrodes 81, 82, each of the piezoelectric ceramic layers 2 sandwiched by the inner electrodes 61, 71 is deformed toward the lamination direction by the piezoelectric effect. As a result, the multilayered piezoelectric element 5 can be largely deformed according to the magnitude of the applied voltage.

In the multilayered piezoelectric element 5 according to the fourth embodiment, the piezoelectric ceramic layers 2 made of crystal oriented ceramics that is made mainly of isotropic perovskite type compound expressed by the general formula (1):

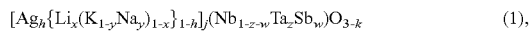

$$[Ag_h\{Li_x(K_{1-y}Na_y)_{1-x}\}_{1-h}]_j(Nb_{1-z-w}Ta_zSb_w)O_{3-k} \quad (1),$$

where $x \leq 0.052$, $y=0.621$, $z=0.095$, $w=0.059$, $h=0.019$, $j=0.981$, and $k=0.35$).

Accordingly, even if the piezoelectric ceramic layers 2 and the inner electrode parts 61 and 71 are integrally fired in the multilayered piezoelectric element 5, it is possible to suppress the conductive metal such as Ag forming the inner electrode parts 61 and 71 to be diffused. That is, as shown in the general formula (1), Ag is contained as the A site element of the isotropic perovskite type compound, expressed by $ABO_3$, in the crystal oriented ceramics forming the piezoelectric ceramic layers 2, it is possible to suppress the diffusion of such a conductive metal. This can suppress the decrease of the electrode formation ratio.

In general, a conductive metal such as Ag is easily substituted by an A site element such as K (potassium) in the isotropic perovskite type compound. However, it is possible to suppress such a substitution with an A site element in the multilayered piezoelectric element 5 according to the fourth embodiment. Therefore it is possible to increase the concentration of A site element such as K near to the boundary of crystal grains in the piezoelectric ceramic layers 2 and thereby to suppress the decrease of the electrical insulation in the piezoelectric ceramic layers 2.

Further, a predetermined amount of Ag in the general formula (1) is added and substituted with A site element in the isotropic perovskite type compound. Still further, in the multilayered piezoelectric element 5 according to the fourth embodiment, the ratio of A site element and B site element is adjusted within the predetermined range ($0.94 \leq j \leq 1$). This structure can suppress any decrease of the orientation ratio and the density. As a result, it is possible for the multilayered piezoelectric element 5 according to the fourth embodiment to have superior deformation properties.

Like the first embodiment, the bulk density, the orientation ratio, the electrode formation ratio, and the displacement ratio (D33) of the multilayered piezoelectric element 5 according to the fourth embodiment were measured. The results are as follows: Bulk density was 4.78 g/cm³, the orientation ratio was 95%, and the electrode formation ratio was 68%. When an electric field of 2 kV is applied to the multilayered piezoelectric element 5, the displacement became 2.3 μm.

Preferred Embodiments to Carry Out the Present Invention

The multilayered piezoelectric element according to the present invention is comprised of the piezoelectric ceramic layers and electrode formation layers which are alternately laminated. The piezoelectric ceramic layers are made of crystal oriented ceramics as polycrystalline material made mainly of an isotropic perovskite type compound. The specific {100} crystal plane of each of crystal grains forming the polycrystalline material is oriented. The electrode formation layers have electrode parts that form inner electrodes containing a conductive metal.

The technical term "isotropic" means that a relative ratio of axis lengths of a, b, and c takes a value within a range of 0.8 to 1.2, an axis angle of each of α, β, and γ thereof is within a range of 80 to 100° when the perovskite type structured $ABO_3$ having a pseudo cubical primitive lattice, and the crystal face or plane has a pseudo cubical {100} crystal plane.

The orientation of the {100} crystal plane means that each of crystal grains of the perovskite type compound is arranged in parallel to each other in the specific {100} crystal plane. Hereinafter, such a state will be referred to as the "oriented plane".

The pseudo cubic {HKL} means that although a structure of isotropic perovskite type compound has in general a structure which is slightly shifted from a square lattice, an oblique lattice, a trigonal lattice, and a cubic lattice, because the shifted amount is very small, the pseudo cubic can be treated as a cubic lattice, and expressed by using mirror indices {HKL}.

When a specific crystal plane is plane-oriented, the plane-orientation degree can be expressed by the following Mathematical equation (1) using an average orientation degree F.(HKL):

$$F(HKL) = [\{\Sigma'I(HKL)/\Sigma I(hkl)\} - \{\Sigma'Io(HKL)/\Sigma Io(hkl)\}]/[1-\{\Sigma'Io(HKL)/\Sigma Io(hkl)\}] \times 100(\%) \quad \text{(Mathematical equation 1)},$$

where $\Sigma I(hkl)$ is a total sum of detected X-ray diffraction strengths of all of crystal planes (hkl) of crystal oriented ceramics, $\Sigma Io(hkl)$ is a total sum of detected X-ray diffraction strengths of all of crystal planes (hkl) of crystal non-oriented ceramics having the same composition of the crystal oriented ceramics, $\Sigma'I(HKL)$ is a total sum of detected X-ray diffraction strengths of a specific crystal plane (HKL) which is equivalent in crystallographic analysis to the crystal oriented ceramics, and Σ'Io(HKL) is a total sum of detected X-ray diffraction strengths of the specific crystal plane (HKL) which is equivalent in crystallographic analysis to the crystal non-oriented ceramics having the same composition of the crystal oriented ceramics.

Accordingly, when each of the crystal grains forming the polycrystalline material is not oriented in any specific plane, the average orientation degree F(HKL) thereof becomes zero. On the other hand, when each of the crystal grains forming the polycrystalline material is oriented into a specific crystal plane, the average orientation degree F(HKL) thereof becomes 100%.

In the crystal oriented ceramics, the more the ratio of the crystal grains oriented in a specific crystal plane is increased, the more the deformation function of the piezoelectric ceramic layers becomes high.

In particular, as previously described, the piezoelectric ceramic layers are comprised of the crystal oriented ceramics made mainly of isotropic perovskite type compound expressed by the general formula (1):

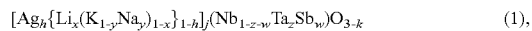

$$[Ag_h\{Li_x(K_{1-y}Na_y)_{1-x}\}_{1-h}]_j(Nb_{1-z-w}Ta_zSb_w)O_{3-k} \quad (1),$$

where $0 \leq x \leq 0.2$, $0 \leq y \leq 1$, $0 \leq z \leq 0.4$, $0 \leq w \leq 0.2$, $x+z+w>0$, $0<h \leq 0.05$, $0.94 \leq j \leq 1$, and $0 \leq k \leq 0.5$).

In the general formula (1), the relationship of "x+z+w>0" means that it is sufficient to contain at least one of Li, Ta, and Sb as a substitution element.

When a compound expressed by the general formula (1) is applied to a composition equation $ABO_3$ of the perovskite structure, it is possible for A site atom to have a composition ratio to be lowered by −6% per 1:1 of the composition ratio of A site element and B site element. That is, this means the relationship of $0.945 \leq j \leq 1$.

When the value "j" in the above relationship of $0.94 \leq j \leq 1$ is less than 0.94, because the ratio of A site atom and B site atom becomes small, there is a possibility that the conductive element such as Ag in the inner electrodes is easily diffused into the piezoelectric ceramic layers in order to fill the A site defect. As a result, this causes a possibility of decreasing the electrode formation ratio in the electrode formation layers.

On the other hand, when the value "j" in the above relationship of $0.94 \leq j \leq 1$ is more than 1, alkali metal component in A site is segregated at crystal-grain boundaries, and becomes a high concentration, and as a result, there is caused a possibility to decrease the insulation resistance and then to make a short circuit.

Further, in the general formula (1), the value "y" indicates a ratio of K and Na that are contained in an isotropic perovskite type compound. It is sufficient to contain at least one of K and Na as A site element in an isotropic perovskite type compound expressed by the general formula (1).

It is preferred for the value "y" in the general formula (1) to take the range of $0<y \leq 1$. In this case, Na becomes an essential component in the component expressed by the general formula (1). In this case, it is possible to increase the piezoelectric characteristics such as a piezoelectric constant $g_{31}$ of the crystal oriented ceramics.

Still further, it is possible for the value "y" in the general formula (1) to take the range of $0 \leq y<1$. In this case, K is an essential component in a compound expressed in the general formula (1). It is therefore possible to produce the multilayered piezoelectric element having superior deformation characteristics because of increasing the piezoelectric constant d in the crystal oriented ceramics. Further, in this case, it is possible to sinter the lamination at a low temperature according to the increase of the amount of added K. It is therefore possible to produce the multilayered piezoelectric element with a low manufacturing cost and decreasing the quantity of energy used.

Moreover, it is preferred for the value "y" in the general formula (1) to be within a range of $0.05 \leq y \leq 0.75$, and more preferable to be within a range of $0.20 \leq y \leq 0.70$. In these cases, it is further possible to increase a piezoelectric constant d31 and an electromechanical coupling factor kp of the crystal oriented ceramics.

It is further preferable for the value "y" in the general formula (1) to be within a range of $0.205 \leq y<0.70$, still further preferable to be within a range of $0.35 \leq y \leq 0.65$, and more further preferable to be within a range of $0.35 \leq y<0.65$. It is most preferable to be within a range of $0.42 \leq y \leq 0.60$.

In the general formula (1), Ag is easily substituted with K. Therefore the more the amount of K is increased, the less the electrode formation ratio is decreased. That is, the increase of the amount of K can more improve the effect to suppress the decrease of the electrode formation ratio by adding Ag. From this viewpoint, it is preferable for the value "y" in the general formula (1) to take a smaller value.

The value "x" in the general formula (1) indicates a substitution amount of Li with which A site element such as K and/or Na is substituted.

The substitution of K and/or Na with Li can increase the piezoelectric properties, increase Curie temperature Tc, and promote a density.

It is preferred that the value "x" in the general formula (1) is within a range of $0<x \leq 0.2$. In this ease, because Li becomes an essential component for the isotropic perovskite type compound expressed by the general formula (1), it is possible to more easily perform the sintering of the crystal oriented ceramics during the firing step. Further, it is thereby possible to improve the piezoelectric characteristics and to further increase the curie temperature Tc of the multilayered piezoelectric element. Because Li becomes the essential component during the range of the value "x" in the general formula (1), it is possible to decrease the firing temperature and for Li to act as firing agent to produce the multilayered piezoelectric element with less number of pores.

When the value "x" exceeds 0.2, there is a possibility of decreasing the piezoelectric characteristics (such as a piezoelectric constant d31, an electromechanical coupling factor kp, a piezoelectric constant g31).

It is possible for the value "x" to have zero (x=0) in the general formula (1). In this case, the general formula (1) can be expressed by $[Ag_h K_{1-y}Na_y)_{1-h}]_j(Nb_{1-z-w}Ta_zSb_w)O_{3-k}$.

In this case, because a compound containing any Li of a light weight is not contained when the crystal oriented ceramics is produced, it is possible to decrease the dispersion of the characteristics caused by varying the raw powders when raw materials are mixed. Further, in this case, the crystal oriented ceramics can have a superior relative permeability and a relatively large piezoelectric constant "g". It is preferable for the value "x" in the general formula (1) to have a range of $0 \leq x \leq 0.15$, and more preferable to have a range of $0 \leq x<0.10$.

The value "z" in the general formula (1) indicates an amount of Ta with which Nb as B site element Nb is substituted. The substitution of a part of Nb with Ta provides increasing the piezoelectric characteristics of the multilayered piezoelectric element. In the general formula (1), when the value "z" exceeds 0.4, the curie temperature Tc of the crystal oriented ceramics is decreased. This causes a possibility of it becoming difficult to apply the multilayered piezoelectric element to household appliances and automobile components.

It is therefore preferred for the value "z" in the general formula (1) to have a range of $0 \leq z < 0.4$. In this case, the isotropic perovskite type compound expressed by the general formula (1), Ta becomes an essential component. Accordingly, this decreases the sintering temperature, and Ta acts as a sintering agent, and can decrease the number of pores in the crystal oriented ceramics.

It is possible for the value "z" to have zero (z=0). In this case, the general formula (1) can be expressed by $[Ag_h\{Li_x(K_{1-y}Na_y)_{1-x}\}_{1-h}]_j(Nb_{1-w}Sb_w)O_3$.

In this case, because a compound expressed by the general formula (1) does not contain any Ta. It is therefore possible for the compound expressed by the general formula (1) can have superior piezoelectric characteristics without using expensive Ta during the production of this compound.

It is preferable for the value "z" in the general formula (1) to have a range of $0 \leq z \leq 0.35$, and more preferable to have a range of $0 \leq x \leq 0.30$.

Still further, the value "w" indicates an amount of Sb with which Nb as B site element is substituted. The substitution of a part of Nb with Sb provides increasing the piezoelectric characteristics of the multilayered piezoelectric element. In the general formula (1), because the piezoelectric characteristics and/or the curie temperature of the crystal oriented ceramics is decreased when the value "w" exceeds 0.2, it must be therefore avoided that the value "w" exceeds 0.2.

It is therefore preferred for the value "w" in the general formula (1) to have a range of $0 < C\ w \leq 0.2$. In this case, the isotropic perovskite type compound expressed by the general formula (1), Sb becomes an essential component. Accordingly, this decreases the sintering temperature, and it is possible to improve the sintering characteristics, and further to increase the stability of a dielectric loss tan $\delta$ of the crystal oriented ceramics.

It is possible for the value "w" to be zero (w=0). In this case, the general formula (1) can be expressed by $[Ag_h\{Li_x(K_{1-y}Na_y)_{1-x}\}_{1-h}]_j(Nb_{1-z}Ta_z)O_3$.

In this case, because a compound expressed by the general formula (1) does not contain any Sb. It is therefore possible for the compound expressed by the general formula (1) not to contain Sb, and possible to have a relatively high curie temperature.

It is therefore preferred for the value "w" in the general formula (1) to have a range of $0 \leq w \leq 0.15$, and more preferable to have a range of $0 \leq w \leq 0.10$.

By the way, the crystal oriented ceramics changes crystal phase from a cubic phase to a tetragonal phase (a curie temperature=a first crystal phase transition temperature), from the tetragonal phase to an orthorhombic phase (a second crystal phase transition temperature), and from the orthogonal phase to a rhombohedral phase (a third crystal phase transition temperature), in order, according to the temperature decrease of a high temperature to a low temperature.

Because the crystal oriented ceramics has no deformation properties, that is, the deformation properties thereof disappears because it becomes the cubic phase at a lower temperature range rather than the first crystal phase transition temperature. Further, the crystal oriented ceramics becomes the orthorhombic phase at a higher temperature range more than the second crystal phase transition temperature. In those cases, the deformation properties and an apparent dynamic electrostatic capacity strongly depend on its temperature. Accordingly, in order for the crystal oriented ceramics to keep a cubic phase, it is desirable to set the first crystal phase transition temperature to more than a use temperature range, and to set the second crystal phase transition temperature to less than the use temperature range.

However, following documents D1 and D2 show that potassium sodium niobate $(K_{1-y}Na_yNbO_3)$ changes crystal phase from a cubic phase to a tetragonal phase (the curie temperature=the first crystal phase transition temperature), from the tetragonal phase to an orthorhombic phase (the second crystal phase transition temperature), and from the orthogonal phase to a rhombohedral phase (the third crystal phase transition temperature), in order, according to the temperature decrease of a high temperature to a low temperature.

D1: Journal of American Ceramic Society, 1959, Vol. 42 [9], pp. 438-442; and

D2: U.S. Pat. No. 2,976,246.

When y=0.5, the first crystal phase transition temperature of the potassium sodium niobate $(K_{1-y}Na_yNbO_3)$ becomes approximately 420° C., the second crystal phase transition temperature becomes approximately 190° C., and the third crystal phase transition temperature becomes approximately −150° C. Accordingly, in this case, the temperature when it is in a cubic phase takes a range of 190 to 420° C. which is not consistent with the use temperature range of commercially available industrial products.

On the other hand, in the crystal oriented ceramics to be used for producing the multilayered piezoelectric element according to the present invention, it is possible to freely change or adjust the first crystal phase transition temperature and the second crystal phase transition temperature by adjusting the amount of elements Li, Ta, Sb and the like in the basic composition of potassium sodium niobate $(K_{1-y}Na_yNbO_3)$.

Following equations B1 and B2 show results of a multiple regression analysis for the substitution amount of Li, Ta, and Sb and detected values of the crystal phase transition temperature during the range of y=0.4 to 0.6, where the piezoelectric characteristics of the multilayered piezoelectric element have a maximum value.

It is apparent from the equations B1 and B2 that the replacement amount of Li increases the first crystal phase transition temperature and decreases the second crystal phase transition temperature. It is also apparent that the replacement amount of Ta and Sb decreases the first crystal phase transition temperature and further decreases the second crystal phase transition temperature.

First crystal phase transition temperature=$(388+9x−5z−17w)\pm 50[°\ C.]$ \hfill (B1);

and

Second crystal phase transition temperature=$(190−18.9x−3.9z−5.8w)\pm 50[°\ C.]$ \hfill (B2).

The first crystal phase transition temperature is a temperature at which the piezoelectric properties completely disappear. Because the dynamic electrostatic capacity is greatly increased near the first crystal phase transition temperature, it is preferred that the first crystal phase transition temperature is set to more than the temperature of the use temperature of the multilayered piezoelectric element of +60° C.

Because the second crystal phase transition temperature is only a temperature to transit the crystal phase of the crystal oriented ceramics, the piezoelectric properties does not disappear, and because it is adequate to set the second crystal phase transition temperature to a temperature range unless any affecting the dynamic electrostatic capacity dependent on the temperature, it is desirable for the second crystal phase transition temperature to have a temperature of not more than the product use temperature+40° C.

On the other hand, the upper limit temperature of the product use temperature is changed according to the applications, such as 60° C., 80° C., 100° C., 120° C., 140° C., or 160° C. The product lower limit temperature is −30° C., or −40° C.

Accordingly, because it is preferred to have the first crystal phase transition temperature of not less than 120° C., it is preferable to place the values "x", "z", and "w" within a relationship of $(388+9x-5z-17w)+50 \geqq 120$. In addition, because it is desirable to have the second crystal phase transition temperature in the equation B2 of not more than 10° C., it is desirable to have the values "x", "z", and "w" within a relationship of $(190-18.9x-3.9z-5.8w)-50 \leqq 10$.

That is, it is preferable for the general formula (1) to have a relationship of $9x-5z-17w \geqq -318$, and $-18.9x-3.9z-5.8w \leqq -130$.

Still further, the value "h" designates a substitution amount of Li, K, and Na as A site element in the general formula (1). The substitution of a part of Li, K, and Na with Ag can suppress the diffusion of the conductive metal from the inner electrode and further suppress the decrease if the electrode formation ratio. The range of the value "h" in the general formula (1) is $0<h \leqq 0.05$. It is more preferable for the value "h" to have $0<h \leqq 0.02$.

When the value "h" exceeds 0.05, there is a possibility of decreasing the deformation properties of the piezoelectric ceramic layers in the multilayered piezoelectric element.

The value "k" in the general formula (1) indicates that an oxygen amount is variable. This variation of the oxygen amount is caused by separating oxygen in order to avoid A site defect with electrical charges, or by separating oxygen from a ceramics by oxidation or reduction of the metal element such as Pb in electrode material containing AgPd alloy and the like during a firing. In the former case, the value "k" has a relationship given by $k=3(1-j)$. On the other hand, in the above oxidation or reduction of the metal element such as Pb as the latter case, the value "k" depends on the atmosphere condition during firing. When firing in air atmosphere condition, the value "k" has a relationship of $k=0.2$ to $0.5$. When firing in an oxygen atmosphere condition, the value "k" has a relationship of $k=0$ to $0.3$.

When the value "k" exceeds 0.5, there is a possibility of decreasing the deformation properties and insulation resistance by oxygen defect.

Next, the electrode formation layers in the multilayered piezoelectric element have electrode parts with which the inner electrodes containing conductive metal are formed.

It is possible to form the electrode part on the entire surface of the electrode formation layer between the adjacent piezoelectric layers. It is also possible to form the partial electrode part on a part of the surface of the electrode formation layer between the adjacent piezoelectric layers. When forming the partial electrode part in the latter case, it is possible to form a non electrode formation part in an area separated from the side surface of the multilayered piezoelectric element.

According to another aspect of the present invention, it is preferred that the piezoelectric layers and the inner electrodes are made of an integrally fired body. In this case, because it becomes easy to diffuse the conductive metal into the piezoelectric layers during the integral firing, adopting the piezoelectric ceramic layers made of the crystal oriented ceramics expressed by the general formula (1) can increase the suppression effect to decrease the electrode formation ratio "y".

Next, the method of producing the multilayered piezoelectric element according to the present invention performs the mixing step, the shaping step, the printing step, the lamination step, and the firing step.

In the mixing step, an anisotropically shaped powder and a reaction raw powder are mixed. The anisotropically shaped powder is made of anisotropically shaped oriented grains.

In the description of the present invention, the anisotropic shape means that a longitudinal length is longer than that of a wide length or a thickness. Specifically, the anisotropic shape is a plate shape, a columnar shape or a prism shape, a scaly shape, or a needle shape.

According to another aspect of the present invention, it is preferred to use the oriented grain having a shape which can be easily oriented in a specific direction during the shaping step. Accordingly, it is preferable for the oriented grain to have an average aspect ratio of not less than 3. When the average aspect ratio is less than 3, it becomes difficult to orient the anisotropically shaped powder into a specified direction or a specific crystal plane during the shaping step. In order to obtain the crystal oriented ceramics having a highly orientating function, it is desirable for the oriented grains to have the aspect ratio of not less than 5. The average aspect ratio is an average value of the maximum dimension/minimum dimension of the oriented grain.

The more the average aspect ratio of the oriented grain is increased, the more the oriented grains are easily oriented to a specific direction or crystal plane. However, the average aspect ratio becomes a large value, there is a possibility of breaking the oriented grains during the mixing step. As a result, during the shaping step, there is a possibility of it being difficult to obtain the shaped body in which the oriented grains are oriented into a specific crystal plane or a specific direction. Accordingly, it is preferable that the oriented grains has the average aspect of not more than 100, more preferable of not more than 50, most preferable of not more than 30.

Because the crystal grains are generated by reaction and sintering of the anisotropically shaped powder and the reaction raw powder during the firing step, there is a possibility that the crystal grain becomes a large size when the oriented grain in the anisotropically shaped powder has a large size, and this decreases the strength of the piezoelectroc ceramic layers made of the crystal oriented ceramics. Accordingly, it is preferred that the maximum dimension of the longitudinal length of the oriented grain has not more than 30 μm, more preferable of not more than 20 μm, further preferable of not more than 15 μm.

On the other hand, when the size of the oriented grain is smaller, the size of the obtained crystal grain becomes small, and this has a possibility of decreasing the piezoelectric properties of the piezoelectric ceramic layer. Accordingly, it is preferred for the oriented grains to have a longitudinal maximum dimension of not less than 0.5 μm, more preferable of not less than 1 μm, and further preferable of not less than 2 μm.

According to another aspect of the present invention, it is preferred that the anisotropically shaped powder is made of an isotropic perovskite-based pentavalent metal acid alkali compound of the expressed by a general formula (2):

$$(K_a Na_{1-a})(Nb_{1-b}Ta_b)O_3 \quad (2),$$

where $0 \leqq a \leqq 0.8$ and $0.02 \leqq b \leqq 0.4$.

In this case, it is possible to easily make the piezoelectric ceramic layers having a dense structure when the anisotropically shaped powder and the reaction raw powder are reacted and simultaneously sintered during the firing step. Therefore it is possible to make the piezoelectric ceramic layers made of the crystal oriented ceramics without performing any press-rolling step, hydrostatic step, or an oxygen-firing step.

In the general formula (2), when $a>0.8$, there is a possibility of it being difficult to form the piezoelectric ceramic layers made of a highly-oriented crystal oriented ceramics because the melting point of the anisotropically shaped powder is decreased.

When $b<0.02$, there is a possibility of having need of performing the rolling step and the CIP step in order to obtain the piezoelectric ceramic layers made of the crystal oriented ceramics with high density and high orientation.

On the other hand, when b>0.4, because an excessive amount of Ta decreases the curie temperature of the piezoelectric ceramic layers, there is a possibility of it becoming difficult to apply the multilayered piezoelectric element to household appliances and automobile parts.

According to another aspect of the present invention, it is preferred that the anisotropically shaped powder is made of an acid treatment material obtained by performing acid treatment of anisotropic-shaped starting raw material made of bismuth layered perovskite type compound expressed by a general formula (3):

$$(Bi_2O_2)^{2+}\{Bi_{0.5}(K_uNa_{1-u})_{m-1.5}(Nb_{1-v}Ta_v)_mO_{3m+1}\}^{2-} \quad (3),$$

where m is an integer of not less than 2, $0 \leq u \leq 0.8$, and $0 \leq v \leq 0.4$.

In this case, it is possible to more increase the orientation ratio of the crystal oriented ceramics while suppressing the decrease of the density. Further, because the acid treatment material is made of plate shaped powder with a smoothed surface, it is possible to increase the oriented characteristics thereof during the shaping step. This can increase the orientation degree of the crystal oriented ceramics. It is thereby possible to produce the piezoelectric ceramic layers with superior piezoelectric properties, and as a result, possible to produce the multilayered piezoelectric element with superior deformation properties.

The composition of the acid treatment material can be detected by using energy dispersive X-ray spectroscopy (EDX) and X-ray diffraction device (XRD).

When the value "u" in the general formula (3) exceeds 0.8, there is a possibility of decreasing the melting point of the anisotropically shaped powder and being difficult to form the piezoelectric ceramic layers made of the crystal oriented ceramics with a high orientation during the firing step.

On the other hand, when value "v" in the general formula (3) exceeds 0.4, there is a possibility of decreasing the curie temperature of the crystal oriented ceramics and being difficult to apply the multilayered piezoelectric element to household appliances and automobile parts.

Still further, when the value "m" has an excess value, there is a possibility of generating anisotropically shaped perovskite grains in addition to the bismuth layered perovskite type compound. Therefore it is preferable for the value "m" to have an integer of not more than 15 in view of increasing the manufacturing yield of the anisotropically shaped powder.

The acid treatment can be carried out by contacting the starting raw material with hydrochloric acid. Specifically, it is possible to adopt the method of mixing the starting raw powder in an acid while heating it.

Next, the reaction raw powder is a raw powder with which the isotropic perovskite type compound expressed by the general formula (1) is produced. It is possible to determine the composition of the reaction raw powder based on the composition of the isotropic perovskite type compound expressed as a target composition by the general formula (1) and the composition of the anisotropically shaped powder.

That is, it is possible to determine the composition of the reaction raw powder, like the production of the isotropic perovskite type compound expressed by the general formula (1) from the anisotropically shaped powder and the reaction raw powder by determining the target composition expressed by the general formula (1) and the composition of the anisotropically shaped powder.

The reaction raw powder is selected from element sources such as Li source, K source, Na source, Nb source, Ta source, Sb source, and Ag source, for example.

It is thereby possible to adopt the firing powder obtained by mixing the element sources in a predetermined mixing ratio, which is necessary for generating the target composition expressed by the general formula (1) by reacting with the anisotropically shaped powder, by firing the obtained raw powder, and pulverizing it according to demand.

Further, during the mixing step, it is possible to add another reaction powder such as second reaction powder and third reaction powder (described later) as a part of the firing powder.

For example, it is possible to use oxide powder, complex oxide powder, hydride powder, carbonate, nitrate, oxalate, or alkoxide as the reaction raw powder and the element sources.

It is possible to mix the anisotropically shaped powder and the reaction raw powder in a reaction stoichiometry of the composition expressed by the general formula (1).

According to another aspect of the present invention, it is preferred that the first reaction raw powder and the second reaction raw powder are used as the reaction raw powder. The second reaction raw powder is made of Ag source. The first reaction raw powder is made of an isotropic perovskite based compound expressed by a general formula (4):

$$\{Li_p(K_{1-q}Na_q)_{1-p}\}_c(Nb_{1-r-s}Ta_rSb_s)O_3 \quad (4),$$

where $0 \leq p \leq 1$, $0 \leq q \leq 1$, $0 \leq r \leq 1$, $0 \leq s \leq 1$, and $0.95 \leq c \leq 1.05$.

In this case, it is possible to more suppress the decrease of the electrode formation ratio in the multilayered piezoelectric element.

That is, in this case, during the firing step, Ag in the second reaction raw powder, prior to the conductive metal, is added into the crystal oriented ceramics of the isotropic perovskite type compound. It is therefore possible to suppress the decrease of the electrode formation ratio which is caused by diffusing the conductive metal of the inner electrodes into the piezoelectric ceramic layers made of the crystal oriented ceramics.

Although it is possible to adopt Ag metal, Ag oxide, compound containing Ag (excepting Ag oxide) as Ag source, this has a possibility of coloring the green sheets black or brown. This would make it difficult to detect the presence of defects formed in the green sheets by transmitting light through the green sheets. Further there is a possibility of decreasing the insulating resistance of the piezoelectric ceramic layers by separating Ag metal after completion of the firing step.

According to another aspect of the present invention, in order to avoid this, it is preferable that $AgNbO_3$ powder and/or $AgTaO_3$ powder is used as the second reaction raw powder.

This can suppress the green sheets from being colored, and the insulation resistance from being decreased. It is more preferable to use $AgNbO_3$ powder.

According to another aspect of the present invention, in the mixing step, the anisotropic shaped powder and the first reaction raw powder are mixed to produce a mole ratio of 0.02 to 0.10:0.98 to 0.90 (anisotropic shaped powder:first reaction raw powder), where a sum of the anisotropic shaped powder and the first reaction raw powder becomes 1 mole.

When the anisotropic shaped powder in the above mixing ratio (mole ratio) is less than 0.02 or the first reaction raw powder exceeds 0.98, there is a possibility of it being difficult to reach an adequately-satisfied orientation ratio in practical use of the crystal oriented ceramics in the piezoelectric ceramic layers.

On the other hand, when the anisotropic shaped powder in the above mixing ratio (mole ratio) exceeds 0.10 or the first reaction raw powder is less than 0.90, there is a possibility of it being difficult to form the piezoelectric ceramic layers made of the crystal oriented ceramics with high density.

According to another aspect of the present invention, in the mixing step, the second reaction raw powder is mixed to produce a mixing ratio of Ag per 1 mole of the sum of the anisotropic shaped powder and the first reaction raw powder becomes not more than 0.05 mole.

When the above mixing ratio exceeds 0.05 mole, there is a possibility of decreasing the deformation properties of the piezoelectric ceramic layers made of the crystal oriented ceramics. It is more preferable to have the mixing ratio of not more than 0.02 mole. It is preferred that the mixing ratio of Ag is not less than 0.005 mole per 1 mole of the sum of the anisotropic shaped powder and the first reaction raw powder.

When the mixing ratio of Ag is less than 0.005 mole, there is a possibility of it being difficult to adequately obtain the effect to suppress the decrease of the electrode formation ratio by adding the second reaction raw powder. The second reaction raw powder is added so that the mixing ratio of Ag contained in the second reaction raw powder, that is, the mixing ratio of Ag in Ag metal based conversion becomes not more than 0.05 mole.

According to another aspect of the present invention, it is preferred that a third reaction raw powder made of $Nb_2O_5$ powder and/or $Ta_2O_5$ powder is used in addition to the first reaction raw powder and the second reaction raw powder.

This condition can more improve the orientation ratio of the crystal oriented ceramics and also increase the deformation properties of the multilayered piezoelectric element.

According to another aspect of the present invention, it is preferred that in the mixing step, the third reaction raw powder is mixed to produce a mixing ratio of the third reaction raw powder becomes not more than 0.02 mole per 1 mole of the sum of the anisotropic shaped powder and the first reaction raw powder.

When the mixing ratio of the third reaction raw powder is more than 0.02 mole, there is a possibility of decreasing the orientation ratio of the crystal oriented ceramics. It is more preferable for the mixing ratio of the third reaction raw powder to be not more than 0.015 mole per 1 mole of the sum of the anisotropic shaped powder and the first reaction raw powder.

In view of a possibility of it being difficult to adequately obtain the orientation effect of the crystal oriented ceramics caused by adding the third reaction raw powder, it is preferred that the mixing ratio of the third reaction raw powder becomes not more than 0.005 mole per 1 mole of the sum of the anisotropic shaped powder and the first reaction raw powder.

It is preferred that the reaction raw powders (the first reaction raw powder, the second reaction raw powder, and the third reaction raw powder) has a grain size of not more than ⅓ of the grain size of the anisotropically shaped powder.

When the grain size of the reaction raw powder exceeds ⅓ of the grain size of the anisotropically shaped powder, there is a possibility of it being difficult to shape the raw mixture in the shaping step so that the specific {100} crystal plane of each of crystal grains of the anisotropically shaped powder is approximately oriented into the same direction. It is more preferable for the reaction raw powder to have the grain size of not more than ¼ of the grain size of the anisotropically shaped powder, and further preferable for it to be not more than ⅕ of the grain size of the anisotropically shaped powder.

It is possible to compare the grain size between the reaction raw powder and the anisotropically shaped powder based on the average grain size or diameter between them. In particular, the grain size of each grain in the anisotropically shaped powder and the reaction raw powder indicates a longer size in a grain.

It is acceptable to perform dry-mixing to mix the anisotropically shaped powder, the reaction raw powder, $Nb_2O_5$ powder, and $Ta_2O_5$ powder, or to perform wet-mixing to mix them by adding a dispersion medium such as water or alcohol. Still further, it is also possible to add at least one selected from a binder, a plasticizer, and a dispersion medium.

In the shaping step, the raw mixture is shaped into a sheet so that the specific {100} crystal plane of each of crystal grains of the anisotropically shaped powder is oriented approximately to the same crystal plane direction.

Various shaping methods can be used unless each of the grains of the anisotropically shaped powder is oriented to the same direction. Specifically, it is preferable to use Doctor blade method, press-shaping method, rolling method, and the like as the shaping method to orient the anisotropically shaped powder in a specified crystal plane. Those shaping methods can orient the anisotropically shaped powder approximately to the same crystal plane direction.

Next, it is preferable to use the electrode material containing AgPd alloy during the printing step. It is preferable to form inner electrodes made of AgPd electrodes.

In general, when the inner electrodes are made from AgPd electrodes, Ag (as electrode material) is easily diffused from the inner electrodes into the piezoelectric ceramic layers. In this case, it is possible to drastically promote the effect of suppressing the decrease of the electrode formation ratio by adopting the piezoelectric ceramic layers made of the crystal oriented ceramics expressed by the general formula (1).

The electrode material can be printed onto a desired area of the green sheets, which become the electrode parts after completion of the firing step.

Specifically, the electrode material is printed on the entire surface of the green sheets so that the electrode parts are formed on the entire surface or a part of the electrode formation layer between the piezoelectric ceramic layers. In the latter ease, namely, when the partial electrode parts are formed, the electrode material is printed on the green sheets (electrode formation layers) so that a part of the electrode parts is formed at an area which is separated from the side surface of the multilayered piezoelectric element.

Next, in the lamination step, a plurality of the green sheets after completion of the printing step is laminated to produce a lamination.

Green sheets on which no electrode material is printed are placed at both the sides of the lamination according to demand.

This produces the multilayered piezoelectric element having dummy layers made of the crystal oriented ceramics formed in the lamination direction at both the sides of the multilayered piezoelectric element after completion of the firing step. One or more dummy layers are formed on both the sides of the lamination.

The lamination after completion of the lamination step is pressed in the lamination direction in order to tightly adhere to each other under a pressure. It is possible to perform this adhesion step under a pressure while heating the lamination. It is possible to remove organic component such as binder from the lamination before the firing step.

Next, it is possible to produce the multilayered piezoelectric element by firing the lamination in order to react and sinter the anisotropically shaped powder and the reaction raw powders, where the multilayered piezoelectric element is made of the piezoelectric ceramic layers and electrode formation layers which are alternately laminated.

In the firing step, the anisotropically shaped powder and the reaction raw powders are reacted together and simultaneously sintered. As a result, it is possible to produce the piezoelectric ceramic layers made of crystal oriented ceramics. This crystal oriented ceramics is made of polycrystalline material made mainly of the isotropic perovskite type compound expressed by the general formula (1). It is also possible to form the inner electrodes in the where the electrode material is printed.

It is possible to select an optimum temperature to perform the firing step in order to efficiently progress the reaction and/or the sintering, and to generate the reaction material having the target composition according to the anisotropically shaped powder and the reaction raw powders to be used, and based on the composition of the crystal oriented ceramics to be produced For example, the firing step is performed at an optimum temperature within a temperature range of 900° C. to 1300° C.

It is also possible to form a pair of external electrodes made of conductive metal such as Ag at an outer peripheral part of the multilayered piezoelectric element. A pair of the external electrodes is electrically connected to the inner electrodes formed in the electrode formation layers alternately formed between the piezoelectric ceramic layers along the lamination direction in the multilayered piezoelectric element.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A multilayered piezoelectric element comprising: piezoelectric ceramic layers and electrode formation layers which are alternately laminated, wherein the piezoelectric ceramic layers are made of crystal oriented ceramics that are polycrystalline material made mainly of an isotropic perovskite type compound in which a specific {100} crystal plane of each of crystal grains that form the polycrystalline material is oriented, and the electrode formation layers have electrode parts that form inner electrodes containing a conductive metal, and the isotropic perovskite type compound is expressed by a general formula (1),

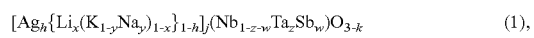

$$[Ag_h\{Li_x(K_{1-y}Na_y)_{1-x}\}_{1-h}]_j(Nb_{1-z-w}Ta_zSb_w)O_{3-k} \qquad (1),$$

where $0 \leq x \leq 0.2$, $0 \leq y \leq 1$, $0 \leq z \leq 0.4$, $0 \leq w \leq 0.2$, $x+z+w>0$, $0<h \leq 0.05$, $0.94 \leq j \leq 1$, and $0 \leq k \leq 0.5$).

2. The multilayered piezoelectric element according to claim 1, wherein each of the inner electrodes is made of an AgPd electrode.

3. The multilayered piezoelectric element according to claim 1, wherein the piezoelectric ceramic layers and the inner electrodes are made of an integrally fired body.

4. The multilayered piezoelectric element according to claim 1, wherein the general formula (1) conforms to the relationship of $9x-5z-17w \geq -318$ and $-18.9x-3.9z-5.8w-130$.

* * * * *

UNITED STATES PATENT AND TRADEMARK OFFICE
CERTIFICATE OF CORRECTION

PATENT NO. : 8,004,161 B2
APPLICATION NO. : 12/474499
DATED : August 23, 2011
INVENTOR(S) : Nagaya et al.

It is certified that error appears in the above-identified patent and that said Letters Patent is hereby corrected as shown below:

In Column 32, lines 30-31, "$-18.9x - 3.9z - 5.8w - 130$" should be
-- $-18.9x - 3.9z - 5.8w \leqq -130$ --

Signed and Sealed this
Twenty-ninth Day of November, 2011

David J. Kappos
*Director of the United States Patent and Trademark Office*